(12) United States Patent
Lee

(10) Patent No.: US 10,566,335 B2
(45) Date of Patent: Feb. 18, 2020

(54) SEMICONDUCTOR DEVICE AND MANUFACTURING METHOD THEREOF

(71) Applicant: SK hynix Inc., Gyeonggi-do (KR)

(72) Inventor: Ki Hong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 26 days.

(21) Appl. No.: 15/861,845

(22) Filed: Jan. 4, 2018

(65) Prior Publication Data

US 2018/0358365 A1 Dec. 13, 2018

(30) Foreign Application Priority Data

Jun. 7, 2017 (KR) .................. 10-2017-0070981

(51) Int. Cl.
| | |
|---|---|
| *H01L 27/11* | (2006.01) |
| *H01L 23/532* | (2006.01) |
| *H01L 23/535* | (2006.01) |
| *G11C 11/40* | (2006.01) |

(52) U.S. Cl.
CPC .......... *H01L 27/1104* (2013.01); *G11C 11/40* (2013.01); *H01L 23/53295* (2013.01); *G11C 2216/04* (2013.01); *H01L 2224/32148* (2013.01)

(58) Field of Classification Search
CPC .................................................. H01L 27/1104
See application file for complete search history.

(56) References Cited

U.S. PATENT DOCUMENTS

| | | | |
|---|---|---|---|
| 9,455,263 B2 | 9/2016 | Zhang et al. | |
| 9,805,805 B1* | 10/2017 | Zhang | H01L 27/11565 |
| 2012/0273865 A1* | 11/2012 | Lee | H01L 27/11582 |
| | | | 257/316 |
| 2012/0329224 A1* | 12/2012 | Kong | H01L 21/0332 |
| | | | 438/268 |
| 2013/0193503 A1* | 8/2013 | Lee | H01L 27/11573 |
| | | | 257/314 |
| 2017/0084624 A1* | 3/2017 | Lee | H01L 27/11582 |

FOREIGN PATENT DOCUMENTS

| | | |
|---|---|---|
| KR | 1020120041314 | 5/2012 |
| KR | 1020160049619 | 5/2016 |

* cited by examiner

*Primary Examiner* — Moazzam Hossain
*Assistant Examiner* — Omar F Mojaddedi
(74) *Attorney, Agent, or Firm* — IP & T Group LLP

(57) ABSTRACT

A semiconductor device includes a stacked structure, channel layers passing through the stacked structure, a well plate located under the stacked structure, a source layer located between the stacked structure and the well plate, a connection structure coupling the channel layers to each other and including a first contact contacting the source layer and a second contact contacting the well plate, and an isolation pattern insulating the source layer and the well plate from each other.

21 Claims, 26 Drawing Sheets

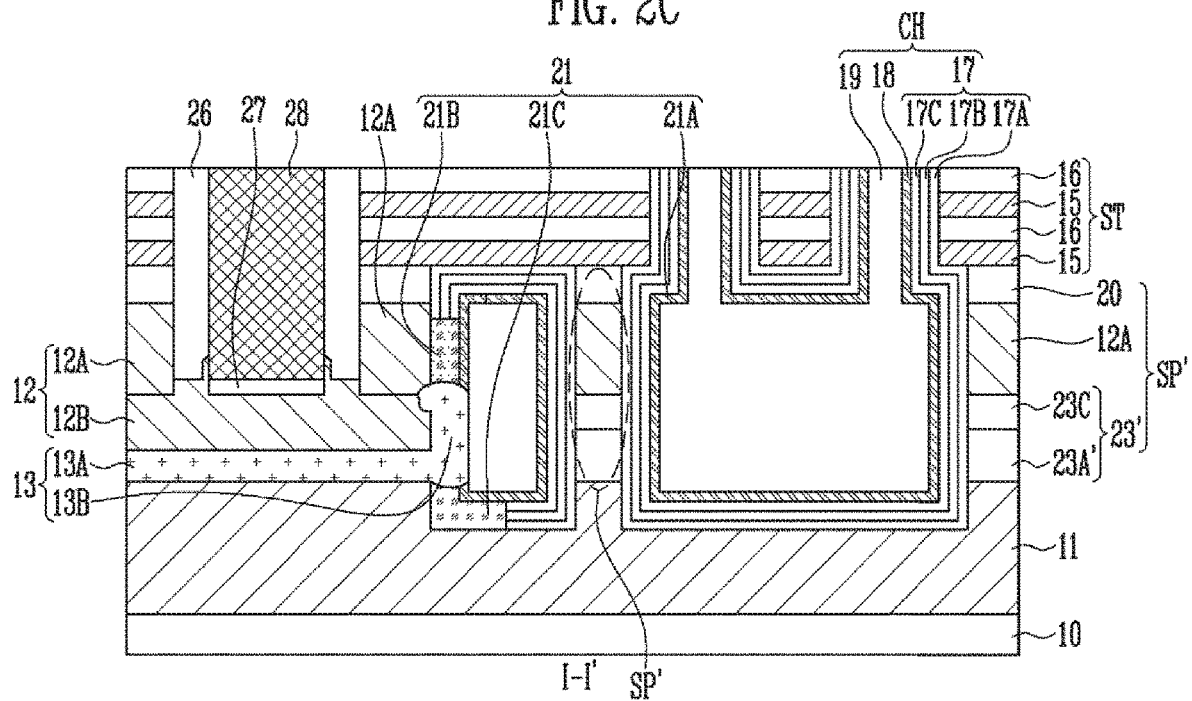
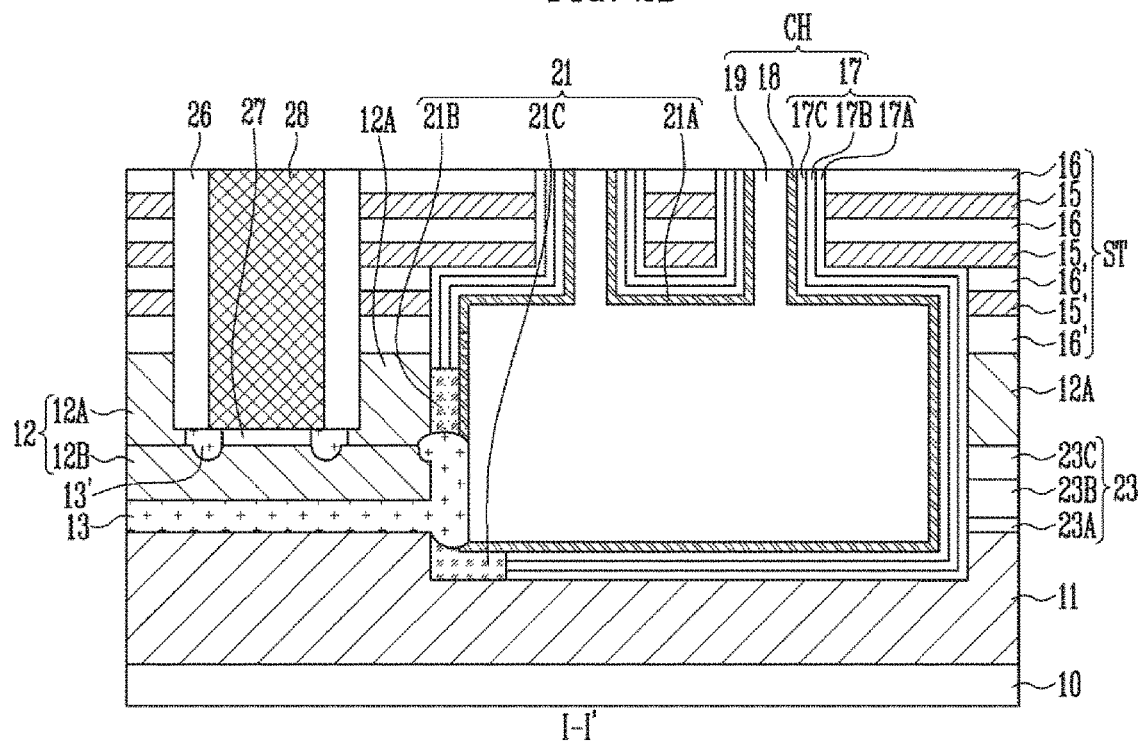

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2017-0070981, filed on Jun. 7, 2017, which is incorporated herein by reference in its entirety.

BACKGROUND

Field of Invention

Various embodiments of the invention relate generally to an electronic device, and more particularly, to a semiconductor device and a manufacturing method thereof.

Description of Related Art

Non-volatile memory devices are used to store data which need to be maintained even in the absence of power supply. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes stacked alternately with each other, and channel layers passing therethrough, and memory cells may be stacked along the channel layers. Various structures and manufacturing methods have been developed to improve the operational reliability of three-dimensional non-volatile memory devices.

SUMMARY

Various embodiments are directed to a semiconductor device with easy manufacturing processes, a stabilized structure and improved characteristics, and a manufacturing method thereof.

According to an embodiment, a semiconductor device may include a stacked structure, channel layers passing through the stacked structure, a well plate located under the stacked structure, a source layer located between the stacked structure and the well plate, a connection structure coupling the channel layers to each other and including a first contact contacting the source layer and a second contact contacting the well plate, and an isolation pattern insulating the source layer and the well plate from each other.

According to an embodiment, a semiconductor device may include a stacked structure, channel layers passing through the stacked structure, a well plate located under the stacked structure, a source layer located between the stacked structure and the well plate, a connection structure located under the stacked structure, and including a coupling pattern coupling the channel layers to each other, a first contact pattern electrically coupling the coupling pattern to the source layer, and a second contact pattern electrically coupling the coupling pattern to the well plate, and an isolation pattern insulating the source layer and the well plate from each other and insulating the first contact pattern and the second contact pattern from each other.

According to an embodiment, a method of manufacturing a semiconductor device may include forming a sacrificial structure on a well plate, forming a stacked structure on the sacrificial structure, forming a semiconductor layer passing through the stacked structure, forming a slit passing through the stacked structure to expose the sacrificial structure, forming an opening by removing the sacrificial structure through the slit, forming an isolation pattern on the well plate exposed through the opening, and forming a first source layer in the opening, wherein the first source layer is insulated from the well plate by the isolation pattern.

BRIEF DESCRIPTION OF THE DRAWINGS

FIGS. 2A to 2D are cross-sectional diagrams illustrating the structure of a semiconductor device according to an embodiment of the present invention;

DETAILED DESCRIPTION

Figure 1A:
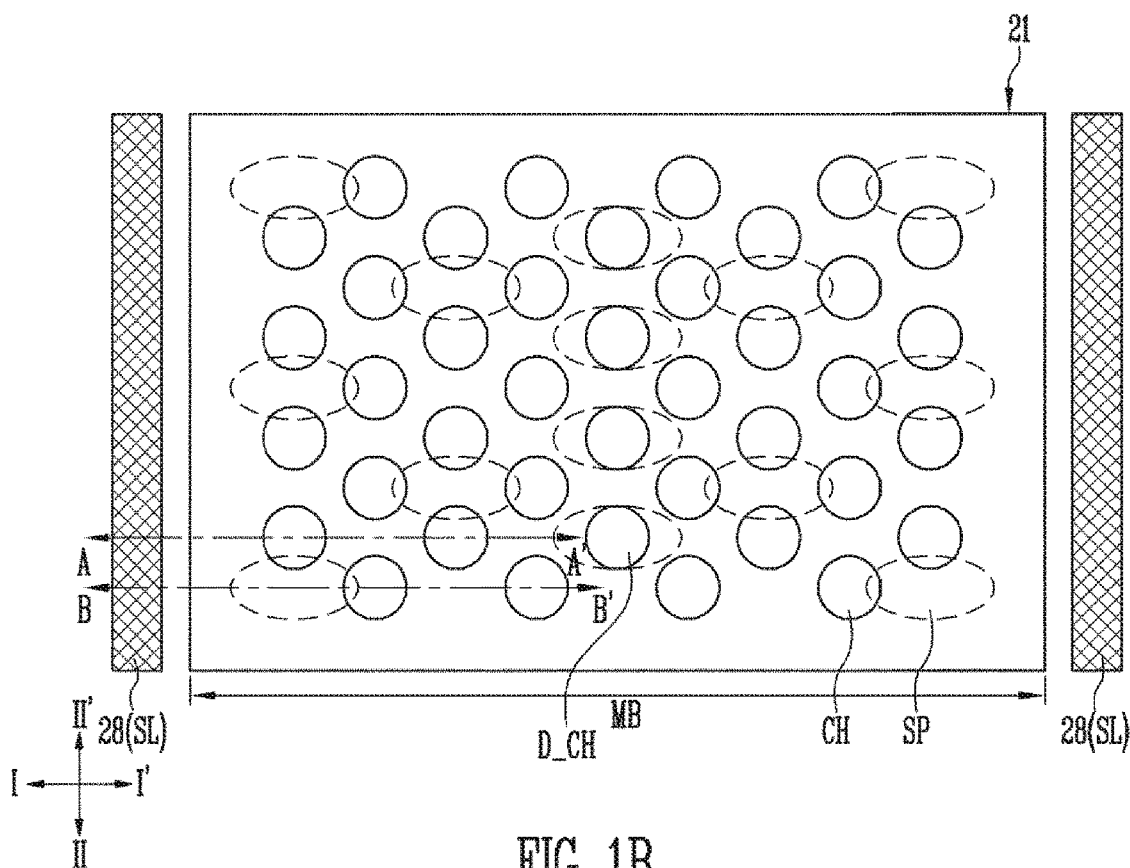
FIGS. 1A to 1F are diagrams illustrating a structure of a semiconductor device according to an embodiment of the present invention.

Hereinafter, various exemplary embodiments will be described in detail with reference to the accompanying drawings. In the drawings, thicknesses and lengths of components may be exaggerated for convenience of illustration. In the following description, a detailed description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In addition, throughout the specification, when it is said that a certain part "includes" a certain element, this does not exclude other elements from being included but the certain part may further include another element unless particularly described otherwise.

A described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer, the first layer may be directly formed on the second layer but may also represent a structure where one or more other intermediate layers may exist between the first layer and the second layer.

Figure 1B:
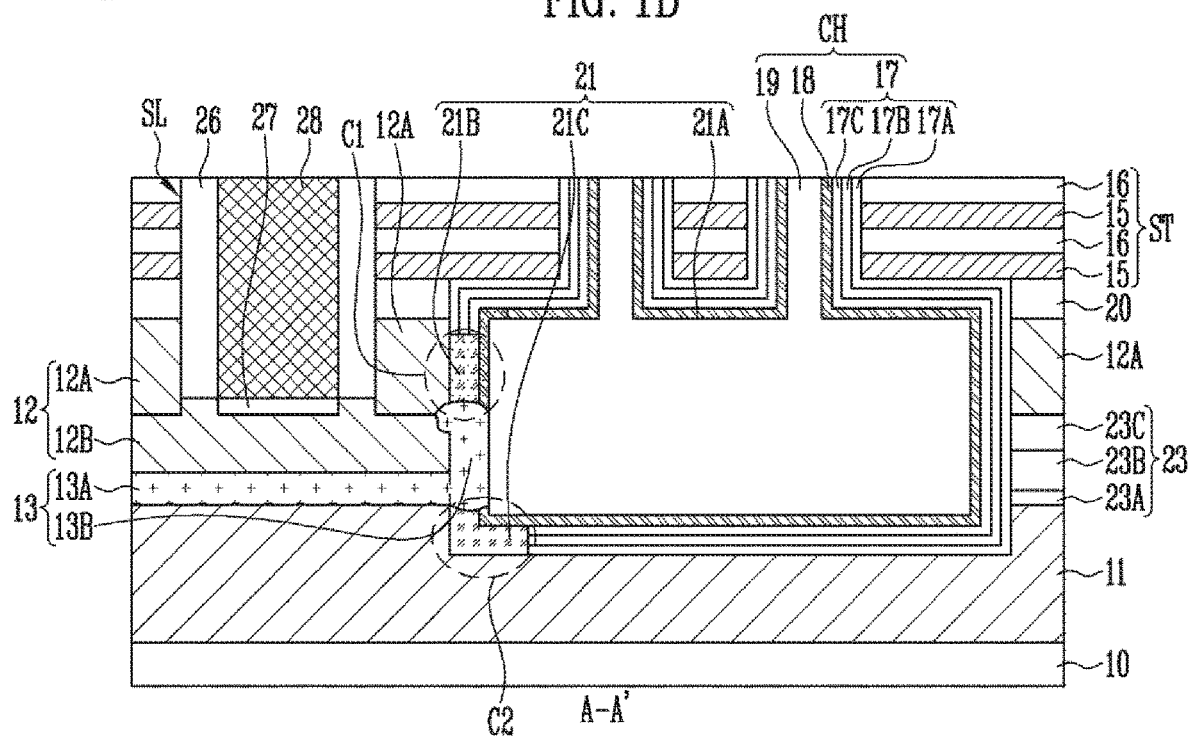
Figure 1C:
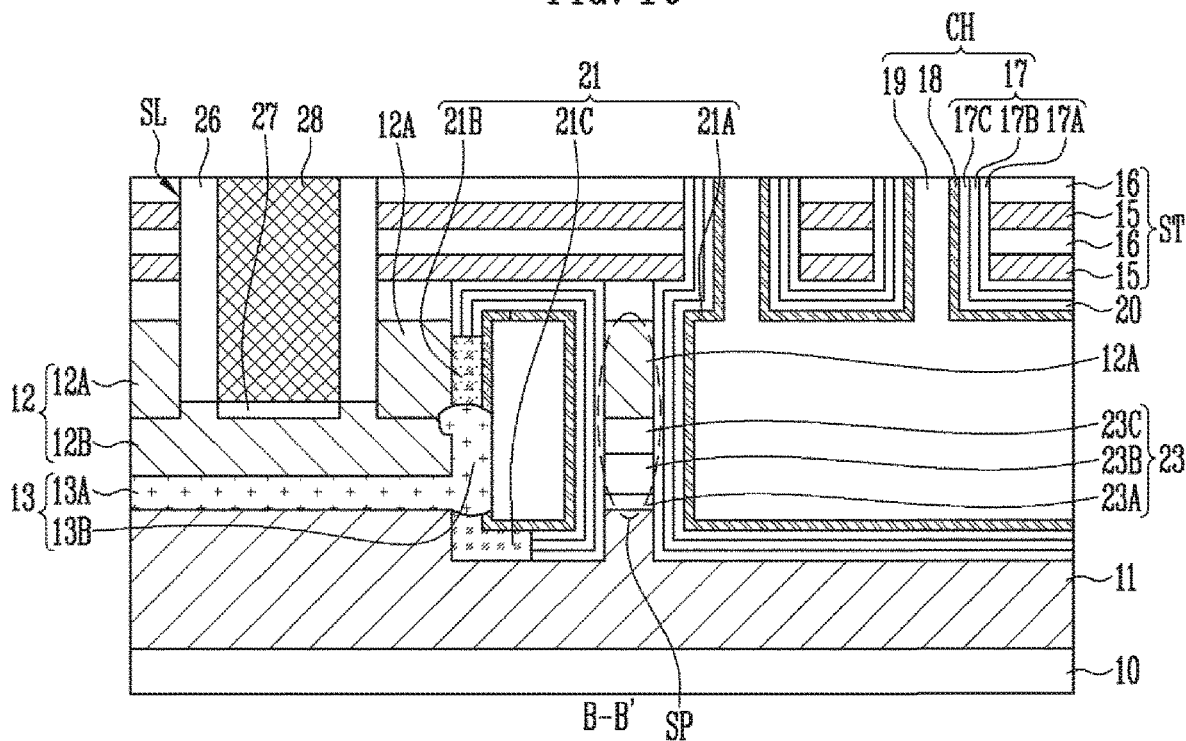

FIGS. 1A to 1F are diagrams illustrating the structure of a semiconductor device according to an embodiment of the present invention. More specifically, FIGS. 1A, 1D, 1E, and 1F are layout views, FIG. 1B is a cross-sectional diagram taken along a line A-A' of FIG. 1A, and FIG. 1C is a cross-sectional diagram taken along a line B-B' of FIG. 1A.

Referring to FIGS. 1A to 1C, the semiconductor device may include a stacked structure ST, channel structures CH passing through the stacked structure ST, a well plate 11 located under the stacked structure ST, a source layer 12 located between the stacked structure ST and the well plate 11, a connection structure 21 coupling channel structures CH to each other, and isolation pattern 13 insulating the source layer 12 and the well plate 11 from each other.

The stacked structure ST may include conductive layers 15 and insulating layers 16 alternately stacked. Each of the conductive layers 15 may be a gate electrode of a selection transistor, a memory cell, or a dummy transistor. The insulating layers 16 may insulate the stacked conductive layers 15 from each other. The insulating layers 16 may be insulating layers such as oxide layers. For example, at least one lowermost conductive layer of the conductive layers 15 may be a gate electrode of a lower selection transistor, at least one uppermost conductive layer of the conductive layers 15 may be a gate electrode of an upper selection transistor, and the remaining conductive layers 15 may be gate electrodes of memory cells. A cell array may include vertical memory strings.

Each of the channel structures CH may include a channel layer 18, a memory layer 17, and a gap-filling insulating layer 19. Each of the channel layers 18 may be a channel layer of a selection transistor or a memory cell. The channel layers may be a semiconductor layer including silicon (Si) or germanium (Ge), or the like. The channel layers 18 may be arranged in a first direction and a second direction II-II' crossing the first direction I-I'. In addition, the channel layers 18 adjacent to each other in the first direction I-I' may be arranged in a staggered form so that centers thereof may be offset from each other.

In addition, dummy channel structures D_CH may be located between the channel structures CH. When the channel structures CH arranged in the second direction II-II' are defined as a single channel column, a dummy channel column including the dummy channel structures D_CH may be located between a fourth channel column and a fifth channel column. Each of the dummy channel structures D_CH may have a similar structure as each of the channel structures CH. In other words, each of the dummy channel structures D_CH may also include the channel layer 18, the memory layer 17 and the gap-filling insulating layer 19. Each of the channel layers 18 may be a channel layer of a dummy selection transistor or a dummy memory cell.

A central portion of each of the channel layers 18 may be opened or filled. The opened central portion of each of the channel layers 18 may be filled with the gap-filling insulating layer 19. In addition, a sidewall of each of the channel layers 18 may be surrounded by the memory layer 17. The memory layer 17 may include a charge blocking layer 17A, a data storing layer 17B, and a tunnel insulating layer 17C. The data storing layer 17B may include a floating gate, a charge trapping material, silicon, nitride, a phase-change material, a resistance-change material, and nanodots.

The well plate 11 may be located on a substrate 10 and the substrate 10 may include a lower structure such as a peripheral circuit. The well plate 11 may be a hole source that provides holes to a memory string during an erase operation. The well plate 11 may be an undoped polysilicon layer.

The source layer 12 may be located between the stacked structure ST and the well plate 11. The source layer 12 may be a conductive layer such as a polysilicon layer, which may be doped with n type impurities.

The source layer 12 may include an upper first source layer 12A and a lower second source layer 12B. The second source layer 12B may be grown from the first source layer 12A. The first source layer 12A may contact a first contact C1 of the connection structure 21, and the second source layer 12B may electrically connect the first source layer 12A to a source pickup line 28. In addition, an interlayer insulating layer 20 may be interposed between the first source layer 12A and the stacked structure ST.

The connection structure 21 may connect the channel layers 18 to each other and include the first contact C1 electrically connected to the source layer 12, and a second contact C2 electrically connected to the well plate 11. The connection structure 21 may provide a current path from the channel layers 18 via the first contact C1 to the source layer 12 during a read operation, or may provide a hole moving path from the well plate 11 via the second contact C2 to the channel layers 18 during an erase operation. The connection structure 21 may be a semiconductor layer such as a polysilicon layer. In addition, the connection structure 21 may include impurities at a portion thereof. For example, an area of the connection structure 21 that is adjacent to the source layer 12 may be doped with n type impurities. These impurities may be diffused from the source layer 12, and the area doped with the impurities may be used as a junction.

The connection structure 21 may include a coupling pattern 21A connecting the channel layers 18 to each other, a first contact pattern 21B connecting the coupling pattern 21A to the source layer 12, and a second contact pattern 21C connecting the coupling pattern 21A to the well plate 11. In addition, the connection structure 21 may further include the gap-fill insulating layer 19 filled in the coupling pattern 21A and the memory layer 17 surrounding the coupling pattern 21A.

The coupling pattern 21A of the connection structure 21 may be a single layer coupled integrally with the channel layers 18. The coupling pattern 21A may have a filled or opened central portion. The opened central portion of the coupling pattern 21A may be filled with the gap-filling insulating layer 19. The gap-filling insulating layer 19 in the coupling pattern 21A and the gap-filling insulating layers 19 in the channel layers 18 may be coupled to form a single layer.

An outer surface of the coupling pattern 21A may be surrounded by the memory layer 17. The memory layer 17 surrounding the coupling pattern 21A and the memory layer 17 surrounding sidewalls of the channel layers 18 may be coupled to form a single layer. An area of the coupling pattern 21A that is directly coupled to the channel layers 18, i.e., an area of the coupling pattern 21A that is located adjacent to the lowermost conductive layer 15 with the memory layer 17 interposed therebetween may serve as a channel layer of a lower selection transistor. In addition, an area of the memory layer 17 located between the coupling pattern 21A and the lowermost conductive layer 15 may serve as a gate insulating layer of a lower selection transistor. Therefore, depending on whether the lower selection transistor is turned on or off, a current path may be generated or disappear in the coupling pattern 21A.

In addition, the memory layer 17 may include an opening through which the first contact C1 and the second contact C2 are exposed. For example, areas of the coupling pattern 21A that are adjacent to the source layer 12 and adjacent to the well plate 11 may be exposed through the opening of the memory layer 17.

The first contact pattern 21B of the connection structure 21 may be a layer grown from the first source layer 12A and the coupling pattern 21A. The second contact pattern 21C may be a layer grown from the well plate 11 and the coupling pattern 21A. For example, the first and second contact patterns 21B and 21C may be grown from the coupling pattern 21A exposed through the opening of the memory layer 17.

The first contact pattern 21B may include impurities. For example, the first contact pattern 21B may include n type impurities. In addition, an area of the coupling pattern 21A that is adjacent to the first contact pattern 21B may be doped with n type impurities.

Therefore, the first contact pattern 21B in contact with the first source layer 12A may be the first contact C1. The area of the coupling pattern 21A that is doped with impurities may also be included in the first contact C1. In addition, an area of the second contact pattern 21C in contact with the well plate 11 may be the second contact C2.

The isolation pattern 13 may be interposed between the well plate 11 and the source layer 12 and insulate the well plate 11 and the source layer 12 from each other. The isolation pattern 13 may be an insulating layer such as an oxide layer. In addition, the isolation pattern 13 may include a first area 13A extending along the surface of the well plate 11, and a second area 13B extending along a sidewall of the connection structure 21.

The second area 13B of the isolation pattern 13 may be interposed between the first contact C1 and the second contact C2. In addition, the second area 13B may contact the gap-filling insulating layer 19 exposed between the first contact pattern 21B and the second contact pattern 21C. Therefore, the isolation pattern 13 may prevent the first contact C1 and the second contact C2 from being directly coupled to each other or directly contacting each other.

The semiconductor device may further include the source pickup line 28. The source pickup line 28 may pass through the stacked structure ST to be electrically coupled to the source layer 12. That is, the source pickup line 28 may be electrically coupled to the second source layer 12B. A junction 27 may be interposed between the source pickup line 28 and the second source layer 12B. In addition, a sidewall of the source pickup line 28 may be surrounded by an insulating spacer 26. Therefore, the source pickup line 28 and the conductive layers 15 may be insulated from each other.

The semiconductor device may include a plurality of connection structures 21. A support body SP may be formed between neighboring connection structures 21. The support body SP may have various cross sections such as a circle, an oval, a rectangle, and a line.

The support body SP may be a residual layer of a sacrificial layer used to form the connection structure 21 and the source layer 12. The support body SP may include a sacrificial structure 23, the first source layer 12A, and the interlayer insulating layer 20. The sacrificial structure 23 may include a first sacrificial layer 23A, a second sacrificial layer 23B, and a third sacrificial layer 23C. The second sacrificial layer 23B may include a material with high etch selectivity compared to the first and third sacrificial layers 23A and 23C. The first sacrificial layer 23A may include a material with high etch selectivity compared to the third sacrificial layer 23C. For example, the first sacrificial layer 23A may be an oxide layer, the second sacrificial layer 23B may be a doped polysilicon layer or an undoped polysilicon layer, and the third sacrificial layer 23C may be a nitride layer. In another example, each of the first and second sacrificial layers 23A and 23B may be a single oxide layer, and the third sacrificial layer 23C may be a nitride layer. In addition, each of the first and third sacrificial layers 23A and 23C may have a multilayered structure including at least one oxide layer and at least one nitride layer.

According to the above-described embodiment, during a read operation, the connection structure 21 may provide a current path from the channel layer 18 via the first contact C1 to the source pickup line 28. For example, a current path from the channel layer 18 to the source pickup line 28 via the coupling pattern 21A, the first contact pattern 21B, the first source layer 12A, and the second source layer 12B may be formed.

In addition, during an erase operation, the connection structure 21 may provide a hole moving path from the well plate 11 via the second contact C2 to the channel layers 18. For example, holes may move from the well plate 11 via the second contact pattern 21C and the coupling pattern 21A to the channel layers 18. In particular, holes may move along the coupling pattern 21A formed on a sidewall of the support body SP. Therefore, a well removal method can be performed, and a sufficient amount of holes may be supplied to the channel layer during the erase operation.

At least one connection structure 21 may be positioned in each of the memory blocks MB. In addition, a slit SL may be located between neighboring memory blocks MB, or in the memory block MB. At least one connection structure 21 may be located between neighboring slits SL. The number of connection structures 21 included in each of the memory blocks MB or the number of connection structures 21 located between neighboring slits SL may vary depending on the arrangement of channels. In addition, the number of channel columns included in each of the connection structures 21 may vary.

Figure 1D:
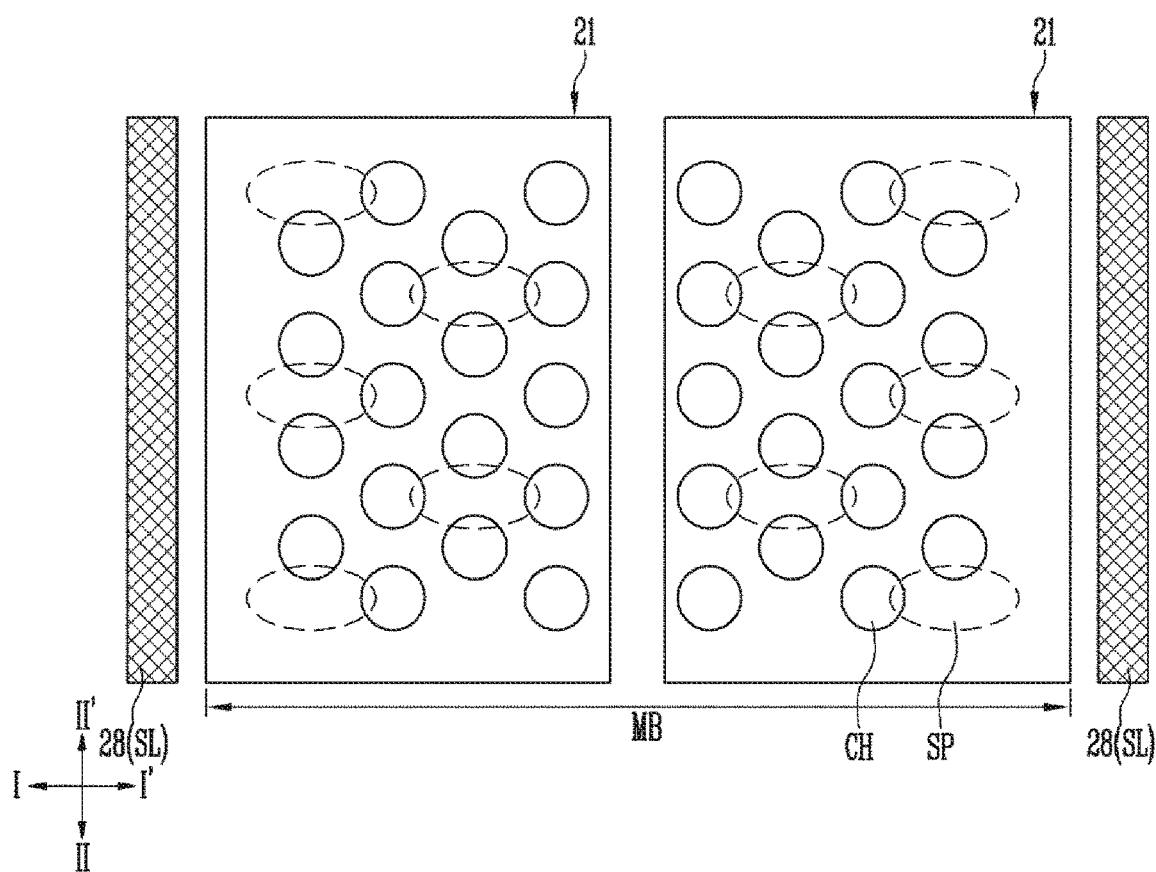
Figure 1E:
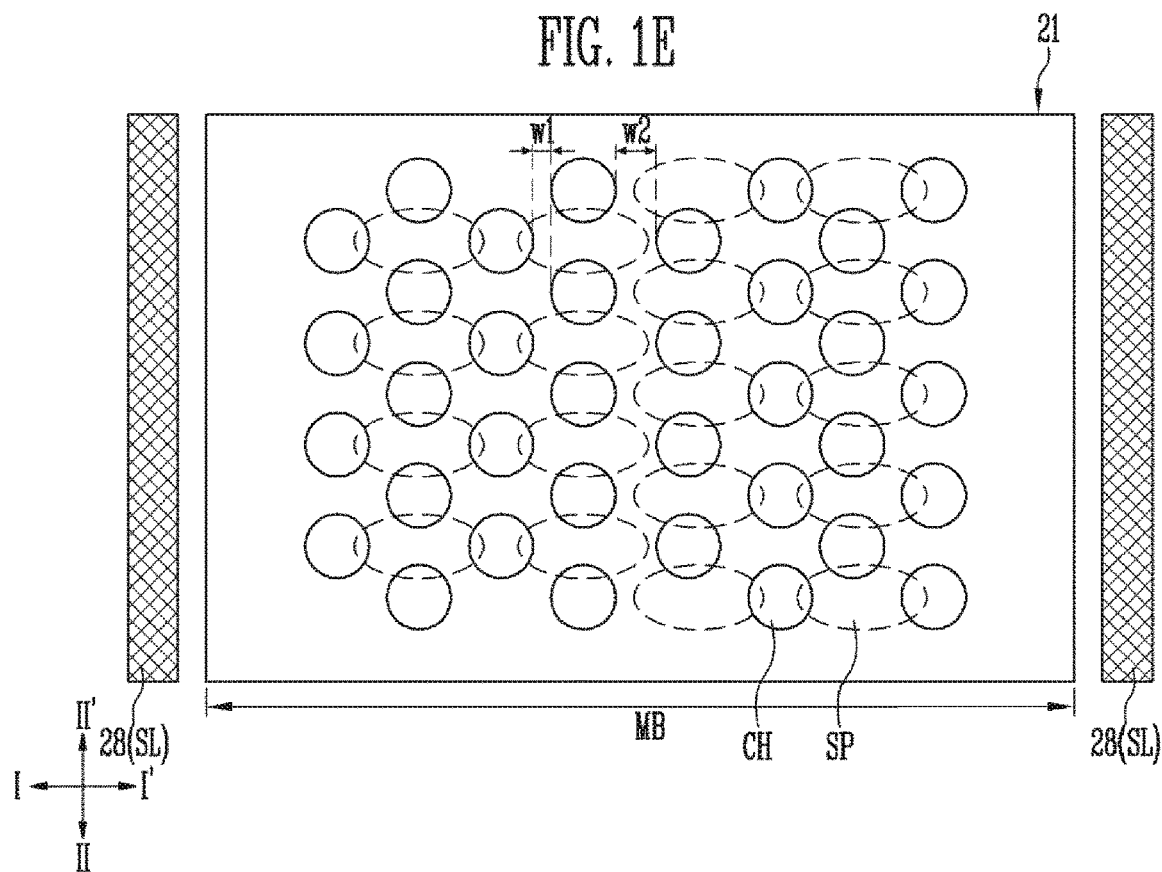
Figure 1F:
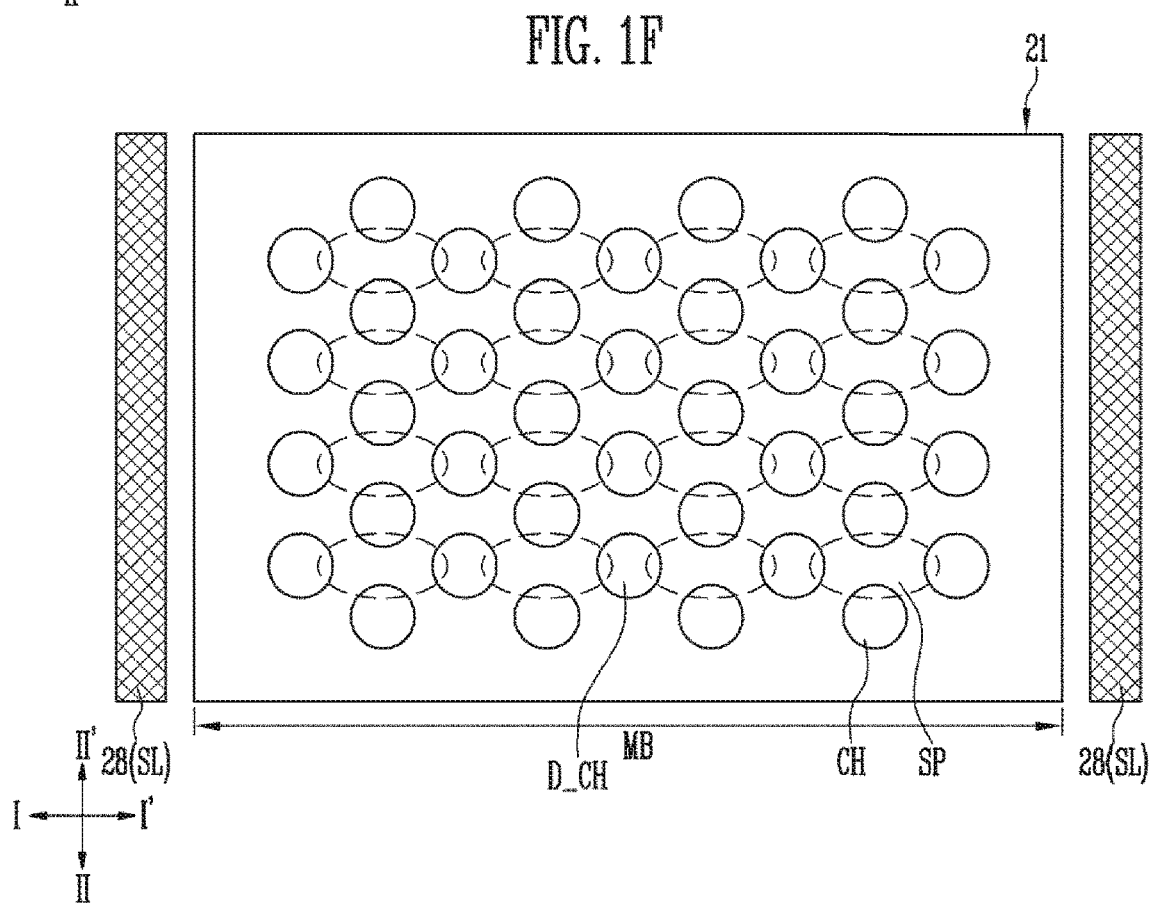

As illustrated in FIG. 1A, one connection structure 21 may be located in one memory block MB or neighboring slits SL, and may include eight channel columns and one dummy channel column. As illustrated in FIG. 1D, two connection structures 21 may be located in one memory block MB or between neighboring slits SL, and each of the connection structures 21 may include four channel columns. As illustrated in FIG. 1E, one connection structure 21 may be located in one memory block MB or between neighboring slits SL, and may include eight channel columns. The distance between the fourth and fifth channel columns may be greater than the distances between the remaining channel columns. As illustrated in FIG. 1F, one connection structure 21 may be located in one memory block MB or between neighboring slits SL, and may include nine channel columns. A dummy channel column including the dummy channel structure D_CH may be located between the fourth and fifth channel columns.

The shape, number, and arrangement of the support bodies SP may vary. The support body SP may partially overlap or not overlap at all with the channel structure CH. In addition, the support body SP may partially or completely overlap with the dummy channel structure D_CH.

FIGS. 2A to 2D are cross-sectional diagrams illustrating a structure of a semiconductor device according to an embodiment of the present invention. FIGS. 2A to 2D are cross-sectional diagrams along a first direction I-I' of FIG. 1A, 1D, 1E or 1F. Hereinafter, a description of common contents with the earlier described embodiment is omitted.

Figure 2A:
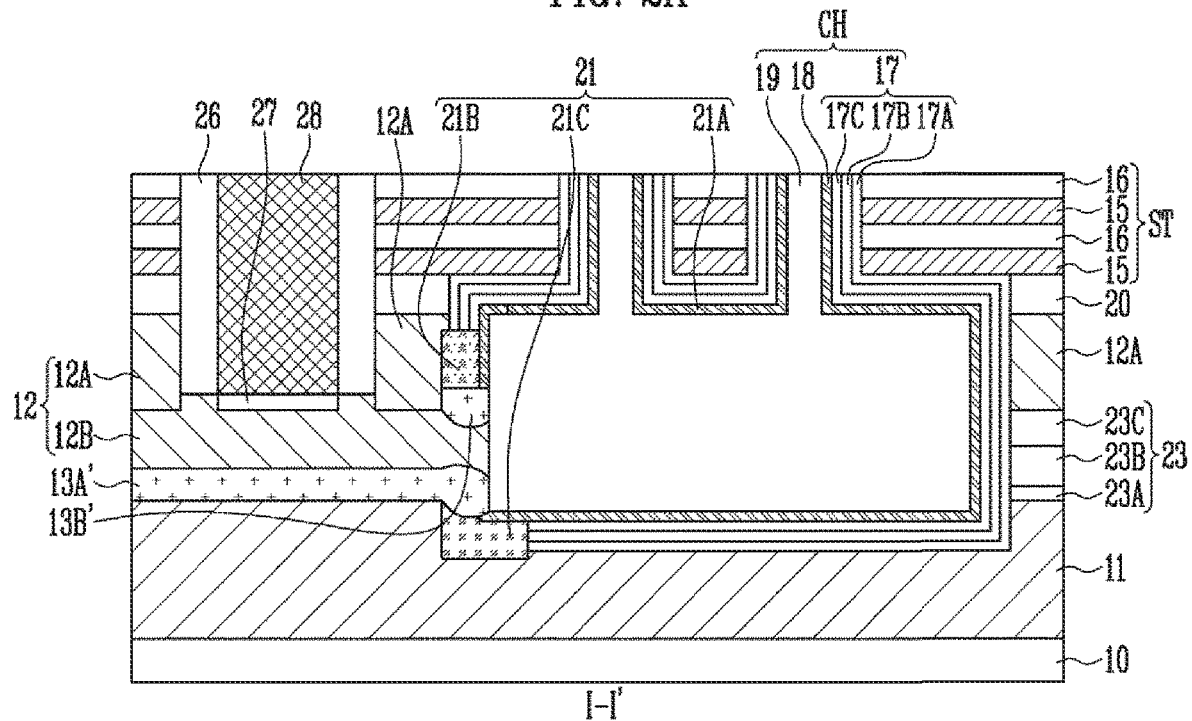

Referring to FIG. 2A, the semiconductor device may have a similar structure as the semiconductor device shown in FIG. 1B. However, as illustrated in FIG. 2A, a first isolation pattern 13A' and a second isolation pattern 13B' may be spaced apart from each other. The second isolation pattern 13B' may be formed at the same time as the first isolation pattern 13A' is formed. The first isolation pattern 13A' may extend along the surface of the well plate 11. The second isolation pattern 13B' may contact a portion of a sidewall of the gap-filling insulating layer 19 of the connection structure 21. According to the above-described structure, the first isolation pattern 13A' may substantially separate the first contact C1 and the second contact C2 of the connection structure 21 from each other.

Figure 2B:
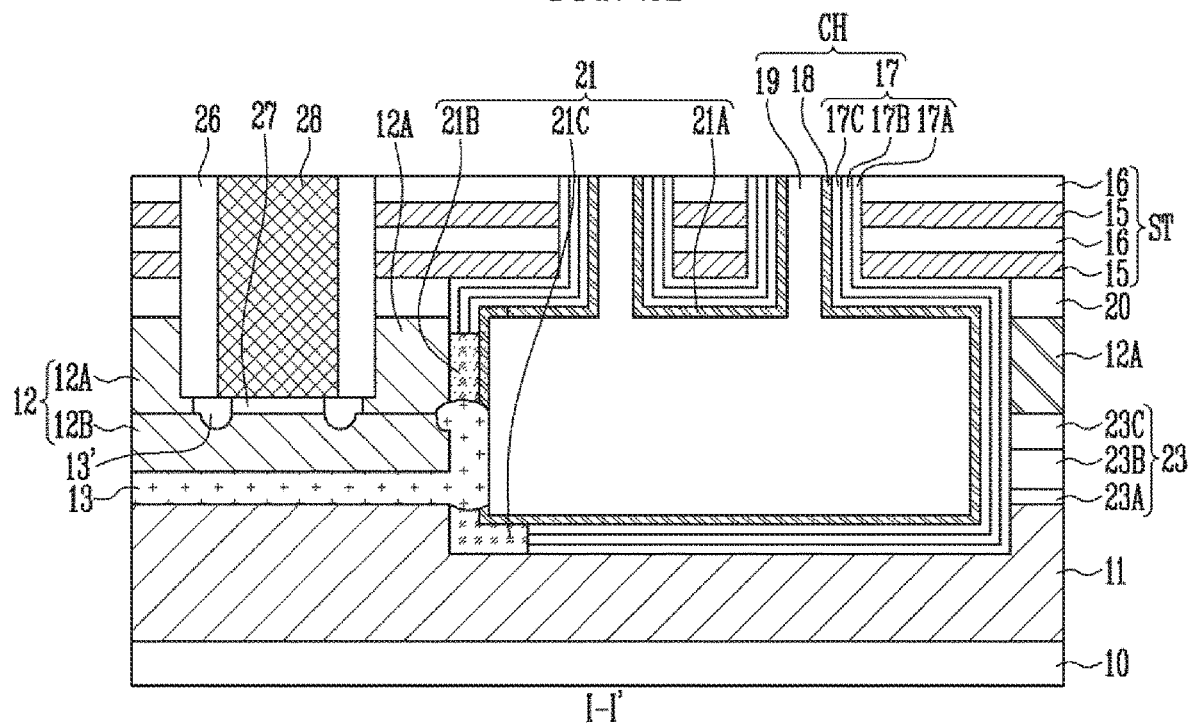

Referring to FIG. 2B, the semiconductor device may include a third isolation pattern 13' located under the source pickup line 28 and the insulating spacer 26, in addition to the isolation pattern 13. The third isolation pattern 13' may be formed at the same time as the isolation pattern 13 is formed. According to the above-described structure, the isolation pattern 13 may separate the first contact C1 and the second contact C2 of the connection structure 21 from each other.

Referring to FIG. 2C, a support body SP' may include a sacrificial layer 23', the first source layer 12, and the interlayer insulating layer 20. The sacrificial layer 23' may include the first sacrificial layer 23A' and the third sacrificial layer 23C. In addition, the first sacrificial layer 23A' may include a material with high etch selectivity compared to the third sacrificial layer 23C. For example, the first sacrificial layer 23A' may be an oxide layer, and the third sacrificial layer 23C may be a nitride layer.

Referring to FIG. 2D, a portion of the connection structure 21 may protrude toward the inside of the stacked structure ST. The connection structure 21 may pass through at least one lowermost conductive layer 15', among the conductive layers 15 and 15', and at least one lowermost insulating layer 16'. That is, the connection structure 21 may overlap with at least one lowermost conductive layer 15' and at least one lowermost insulating layer 16'. The conductive layer 15' overlapping with the connection structure 21 may be a gate electrode of a dummy transistor, a gate electrode of a lower selection transistor, a gate electrode of an upper selection transistor, or a gate electrode of a memory cell.

When impurities are diffused from the source layer 12 to the connection structure 21, the impurities may also be diffused into a channel layer of a selection transistor which is not a dummy selection transistor or a channel layer of a memory cell which is not a dummy memory cell. However, to perform an erase operation by injecting holes from the well plate 11, the impurities of the source layer 12 may only be diffused into a portion of the coupling pattern 21A that is adjacent to the slit SL, and may not reach the channel layer 18. Therefore, it may be difficult to control the location of the junction. As a result, characteristics of the transistor may be affected. However, according to the above-described structure, since the distance from the source layer 12 to the channel layer 18 is increased, a margin of impurity diffusion can be ensured, making it easier to control the location of the junction.

FIGS. 3A to 3I are cross-sectional diagrams illustrating a method of manufacturing a semiconductor device according to an embodiment of the present invention.

Figure 3A:
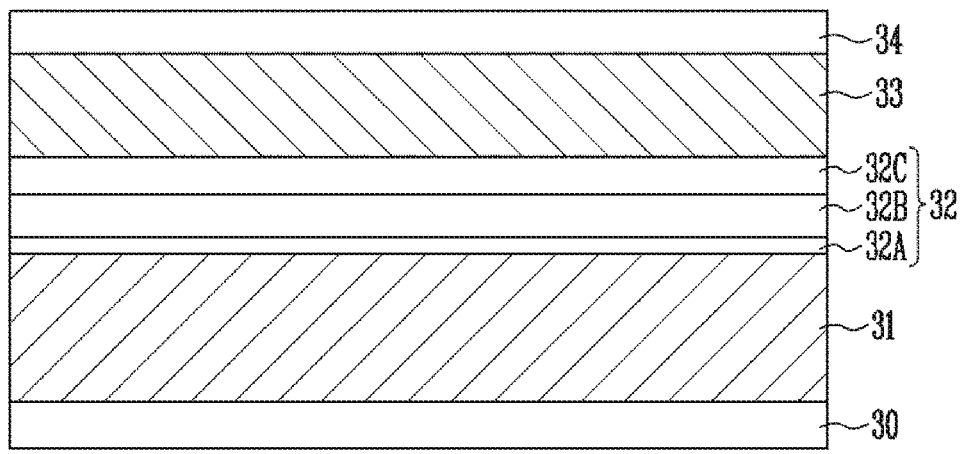
FIGS. 3A to 3I are cross-sectional diagrams illustrating a method of manufacturing a semiconductor device according to an embodiment of the present invention.

Referring to FIG. 3A, a well plate 31, a sacrificial structure 32, a first source layer 33, and an interlayer insulating layer 34 may be sequentially formed over a substrate 30. The well plate 31 may be an undoped polysilicon layer or a polysilicon layer including p type impurities. In addition, the interlayer insulating layer 34 may be an oxide layer formed by oxidation. The oxide layer may have a relatively low wet etch rate.

The sacrificial structure 32 may be a multilayer film including a first sacrificial layer 32A, a second sacrificial layer 32B, and a third sacrificial layer 32C. For example, the first sacrificial layer 32A may be an oxide layer, the second sacrificial layer 32B may be a doped polysilicon layer, and the third sacrificial layer 32C may be a nitride layer. In another example, the first sacrificial layer 32A may be an oxide layer, the second sacrificial layer 32B may be an undoped polysilicon layer, and the third sacrificial layer 32C may be a nitride layer. In addition, the sacrificial structure 32 may further include an oxide layer interposed between the second sacrificial layer 32B and the third sacrificial layer 32C. The number of layers and kinds of materials included in the sacrificial structure 32 may vary. For example, the sacrificial structure 32 may change according to a manufacturing order, a memory layer to be formed later, and the material of the stacked structure.

Figure 3B:
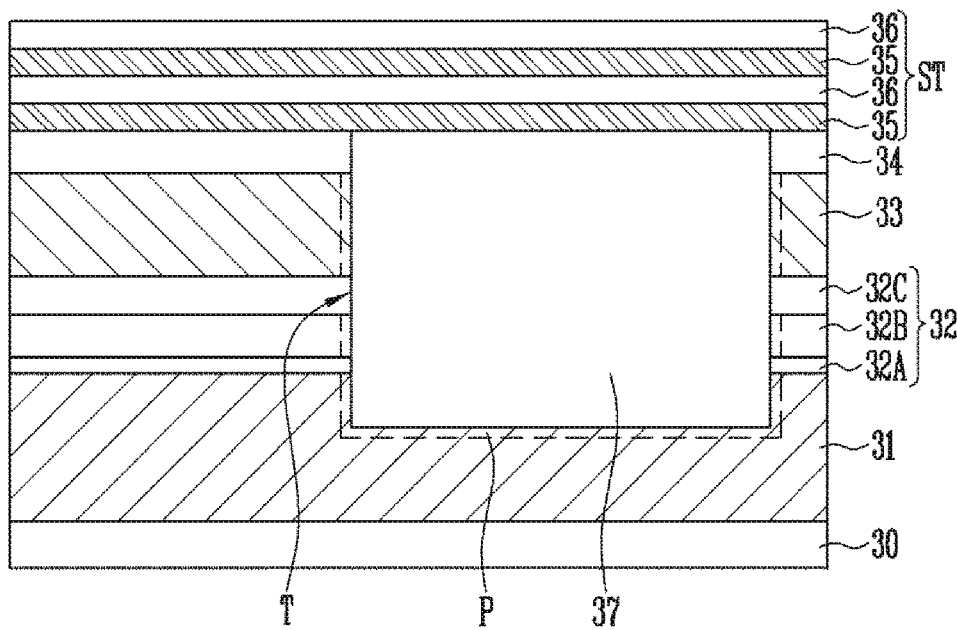

Referring to FIG. 3B, the trench T may be formed in the interlayer insulating layer 34, the first source layer 33, the sacrificial structure 32 and the well plate 31. For example, the trench T may be formed by etching the interlayer insulating layer 34, the first source layer 33, and the sacrificial structure 32, and subsequently etching the well plate 31 by a predetermined depth.

Though not shown in FIG. 3B, the support bodies SP described above with reference to FIGS. 1A and 1C may be defined when the trench T is formed. For example, the trench T may be formed by etching the interlayer insulating layer 34, the first source layer 33, the sacrificial structure 32 and the well plate 31, except for an area for the support bodies SP. Accordingly, the support bodies SP may protrude toward the inside of the trench T.

Subsequently, a fourth sacrificial layer 37 may be formed in the trench T. The fourth sacrificial layer 37 may be a single layer or a multilayer film. The fourth sacrificial layer 37 may be a single layer including a titanium nitride or a tungsten, or a multilayer film including a combination thereof.

Before the fourth sacrificial layer 37 is formed, a passivation layer P may be formed. For example, an oxide layer (not illustrated) may be formed on an inner surface of the trench T. Alternatively, the well plate 31, the second sacrificial layer 32B, and the first source layer 33 exposed through the trench T may be oxidized by a predetermined thickness to form an oxide layer. Since the well plate 31, the second sacrificial layer 32B, and the first source layer 33 are not exposed through the trench T, the fourth sacrificial layer 37 may include a similar material to the well plate 31, the second sacrificial layer 32B, or the first source layer 33. For example, the fourth sacrificial layer 37 may form a polysilicon layer doped with n type impurities, or a multilayer film of titanium nitride/polysilicon.

Subsequently, the stacked structure ST may be formed on an intermediate resultant in which the fourth sacrificial layer 37 is formed. The stacked structure ST may include first material layers 35 and second material layers 36, both of which are stacked alternately with each other. The first material layers 35 may be provided to form gate electrodes of memory cells and selection transistors. The second material layers 36 may insulate the stacked gate electrodes from each other. The first material layers 35 may include a material having high etch selectivity compared to the second material layers 36. For example, each of the first material layers 35 may be a sacrificial layer including a nitride and each of the second material layers 36 may be an insulating layer including an oxide. In another example, each of the first material layers 35 may be a conductive layer including polysilicon and tungsten, and each of the second material layers 36 may be an insulating layer including an oxide. In another example, each of the first material layers 35 may be a conductive layer including doped polysilicon, and each of the second material layers 36 may be a sacrificial layer including undoped polysilicon.

Figure 3C:
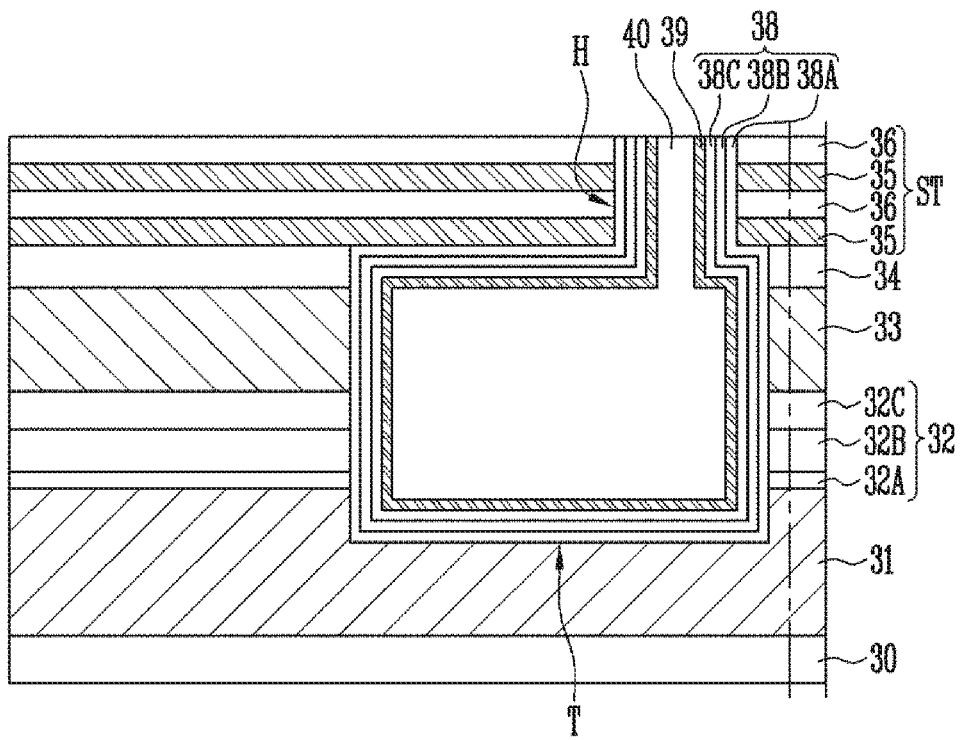

Referring to FIG. 3C, holes H may be formed through the stacked structure ST and coupled to the trench T. Although one of the holes H are shown in FIG. 3C, a plurality of holes H may be coupled to a single trench T.

Subsequently, the fourth sacrificial layer 37 may be removed through the holes H, so that the holes H and the trench T may be integrally coupled to each other. The remaining first to third sacrificial layers 32A to 32C and the interlayer insulating layer 34 may function as support bodies supporting the stacked structure ST.

Then, a memory layer 38 may be formed in the trench T and the holes H. The memory layer 38 may be formed on inner surfaces of the trench T and the holes H, and also on surfaces of the support bodies protruding toward the inside of the trench T. The memory layer 38 may include a charge blocking layer 38A, a data storing layer 38B, and a tunnel insulating layer 38C. The data storing layer 38B may include a floating gate, a charge-trapping material, a silicon, a nitride, a phase change material, a resistance change material, and nanodots. Furthermore, as an example, the charge blocking layer 38A may be an oxide layer, the data storing layer 38B may be a nitride layer, and the tunnel insulating layer 38C may be an oxide layer.

After the memory layer 38 is formed in the trench T and the holes H, a semiconductor layer 39 may be formed in the memory layer 38. The semiconductor layer 39 may include silicon or germanium. In addition, portions of the semiconductor layer 39 that are formed in the holes H may serve as channel layers, and a portion of the semiconductor layer 39 that is formed in the trench T may serve as a coupling pattern, which couples the channel layers to each other. Subsequently, a gap-filling insulating layer 40 may be formed in the semiconductor layer 39.

Figure 3D:
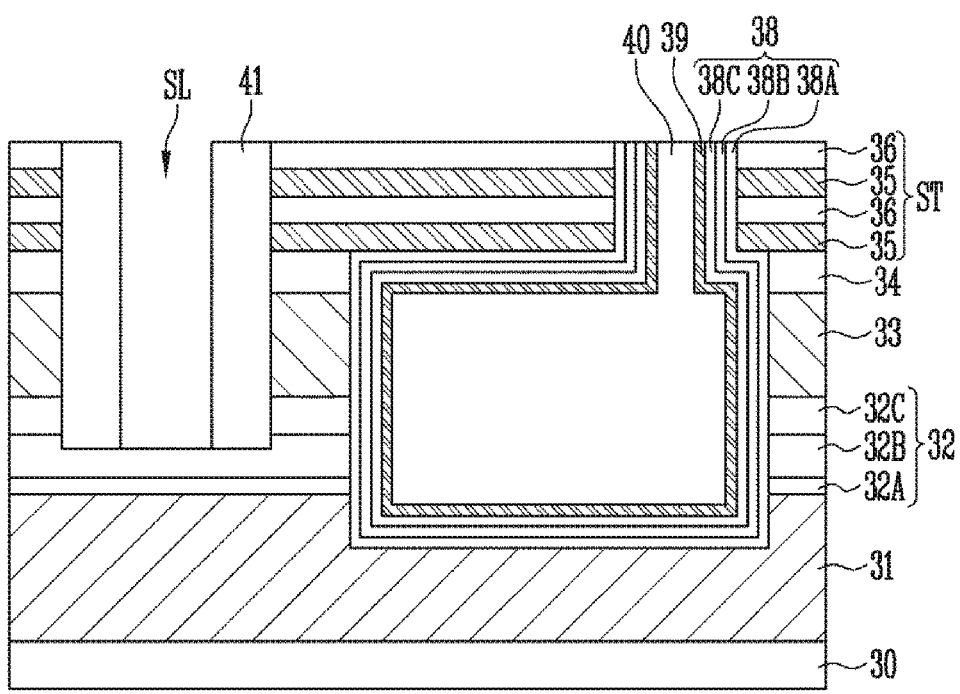

Referring to FIG. 3D, the slit SL may be formed through the stacked structure ST. The slit SL may have a depth at which the slit SL may be formed through the stacked structure ST, the interlayer insulating layer 34, and the first source layer 33, and a portion of the sacrificial structure 32. For example, the slit SL may have a depth at which the slit SL passes through the stacked structure ST, the interlayer insulating layer 34, the first source layer 33, and the third sacrificial layer 32C, but exposes the second sacrificial layer 32B.

After forming the slit SL through the stacked structure ST, a spacer 41 may be formed on an inner wall of the slit SL. For example, a material layer may be formed on a surface of a resultant structure in which the slit SL is formed, and the spacer 41 may be formed on the inner wall of the slit SL by a blanket etch process. The spacer 41 may include a material having high etch selectivity compared to the second sacrificial layer 32B. For example, when the second sacrificial layer 32B is a polysilicon layer, the spacer 41 may be a nitride layer.

Figure 3E:
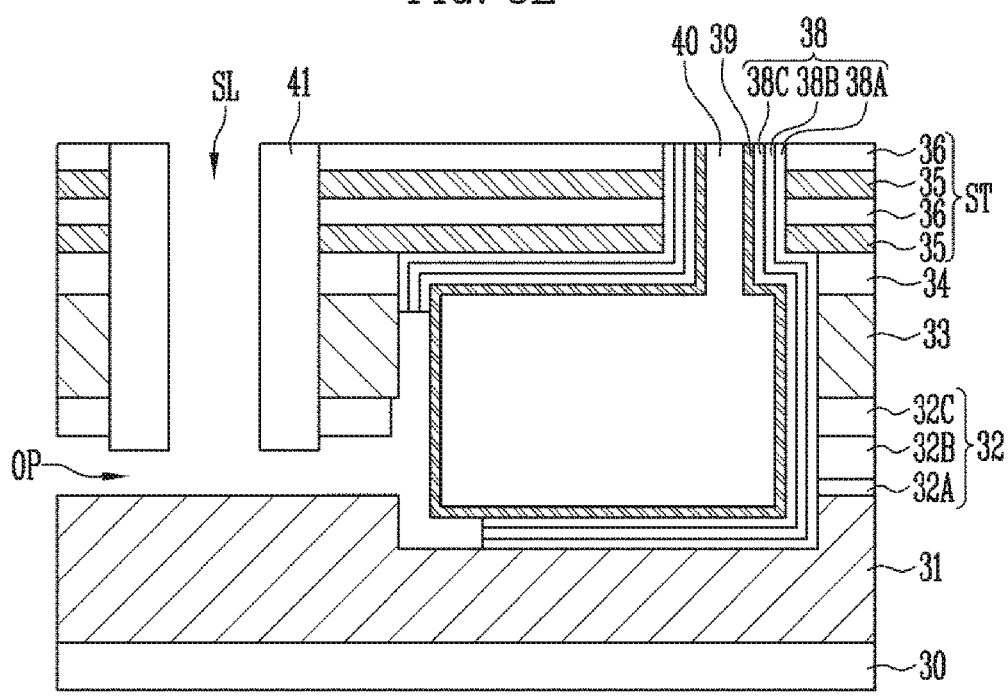

Referring to FIG. 3E, an opening OP may be formed by removing the second sacrificial layer 32B through the slit SL. Subsequently, the semiconductor layer 39 may be exposed by removing the memory layer 38 exposed through the opening OP. A contact layer may be formed in the area from which the memory layer 38 is removed. Therefore, a range within which the memory layer 38 is removed may be determined in consideration of areas where first contact patterns and second contact patterns are formed. For example, the memory layer 38 may be removed to expose the sidewall of the first source layer 33 and the well plate 31 under the trench T.

When the memory layer 38 is removed, the first sacrificial layer 32A may be removed and the third sacrificial layer 32C may be partially removed. For example, when the memory layer 38 includes the charge blocking layer 38A that is the oxide layer, the data storing layer 38B that is the nitride layer, and the tunnel insulating layer 38C that is the oxide layer, the charge blocking layer 38A may be selectively removed first. The first sacrificial layer 32A may also be removed, so that the well plate 31 may be exposed. After the oxide layer 38A is selectively removed, the data storing layer 38B may then be selectively removed. A portion of the third sacrificial layer 32C may be removed, so that the first source layer 33 may be exposed through the opening OP. Subsequently, the tunnel insulating layer 38C may be selectively removed, so that the semiconductor layer 39 may be exposed through the opening OP.

Figure 3F:
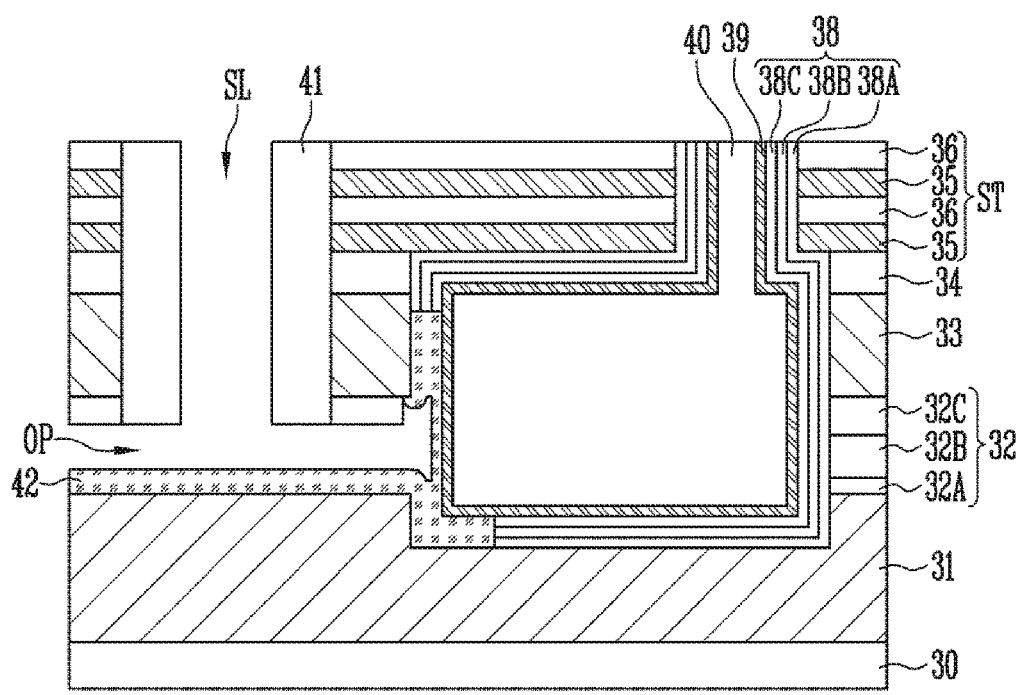

Referring to FIG. 3F, a contact layer 42 may be formed on the semiconductor layer 39, the first source layer 33, and the well plate 31 exposed through the opening OP. The contact layer 42 may be a semiconductor layer formed using a selective growth process. For example, a polysilicon layer may be selectively grown from the semiconductor layer 39, the first source layer 33, and the well plate 31. In terms of material characteristics, the semiconductor layer 39, the first source layer 33, and the well plate 31 may function as a seed, whereas the spacer 41 and the remaining third sacrificial layer 32C may not be a seed. Therefore, the contact layer 42 may be formed only on the surfaces of the semiconductor layer 39, the first source layer 33, and the well plate 31. The contact layer 42 may be an undoped polysilicon layer. The contact layer 42 may be formed by a deposition method, which is described below with reference to FIGS. 6A to 6E.

Figure 3G:
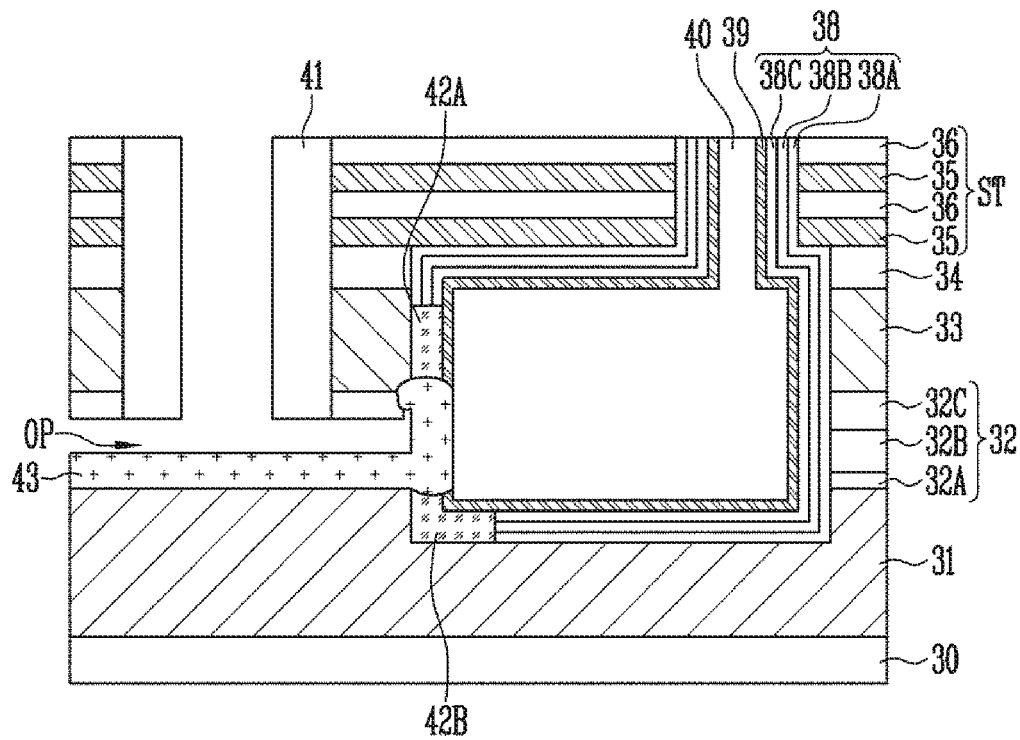

Referring to FIG. 3G, an isolation pattern 43, a first contact pattern 42A, and a second contact pattern 42B may be formed. For example, the contact layer 42 exposed through the opening OP may be partially oxidized to form the isolation pattern 43. A portion of the contact layer 42 that is inserted between the first source layer 33 and the semiconductor layer 39 may not be exposed through the opening OP. Thus, the corresponding portion may remain as the first contact pattern 42A without being oxidized. In the same manner, since a portion of the contact layer 42 that is inserted between the well plate 31 and the semiconductor layer 39 is not exposed through the opening OP, the corresponding portion may remain as the second contact pattern 42B without being oxidized. Therefore, the first contact pattern 42A contacting the first source layer 33 and the second contact pattern 42B contacting the well plate 31 may be formed. The first contact pattern 42A and the second contact pattern 42B may be semiconductor patterns.

In addition, the first contact pattern 42A may couple the semiconductor layer 39 and the first source layer 33 to each other, and the second contact pattern 42B may couple the semiconductor layer 39 and the well plate 31 to each other. Therefore, the first source layer 33 may be coupled to the channel layers through the first contact pattern 42A, and the well plate 31 may be coupled to the channel layers through the second contact pattern 42B. Therefore, a connection structure including a first contact contacting the first source layer 33 and a second contact contacting the well plate 31 may be formed.

Figure 3H:
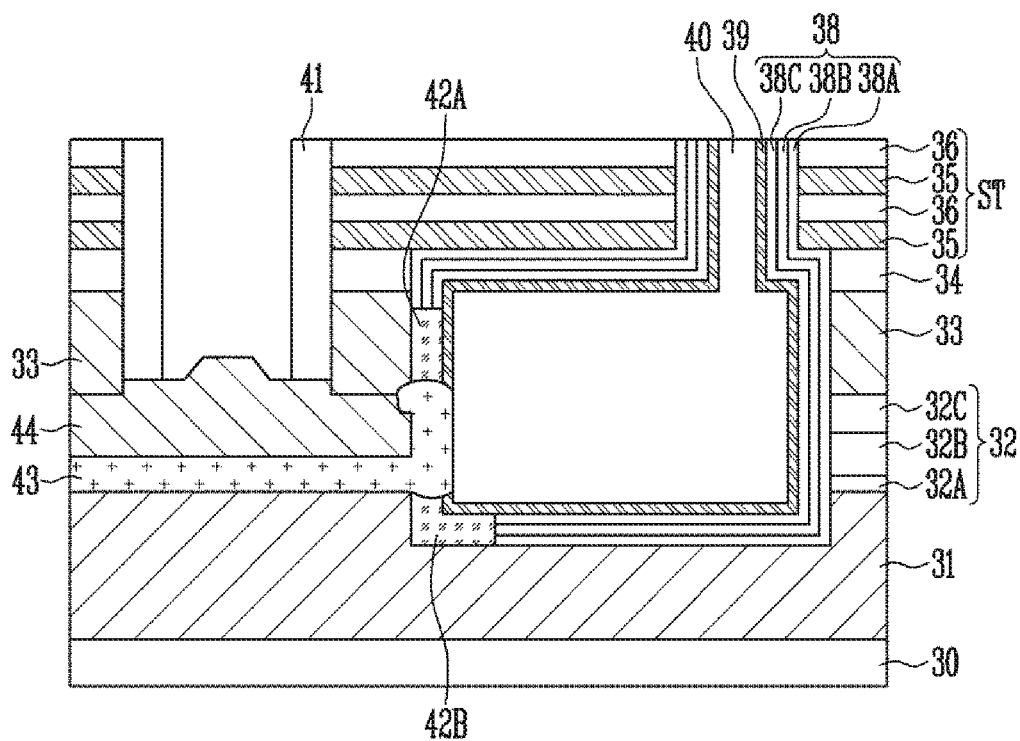

Referring to FIG. 3H, the first source layer 33 may be exposed by removing the remaining third sacrificial layer 32C. For example, the third sacrificial layer 32C may be removed by a strip process. At the same time, the spacer 41 may also be partially removed.

Subsequently, a second source layer 44 may be formed in the opening OP. For example, a polysilicon layer may be grown from the first source layer 33 exposed through the opening OP to form the second source layer 44. The second source layer 44 may be a doped polysilicon layer and include n type impurities.

Figure 3I:
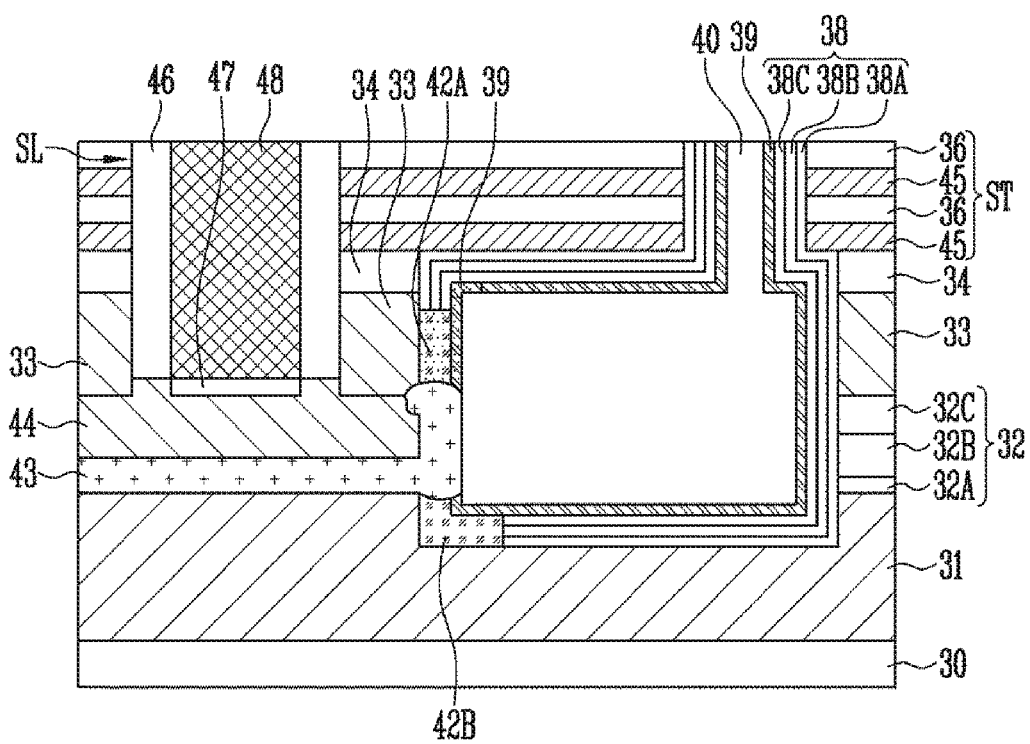

Referring to FIG. 3I, after the remaining spacer 41 is removed, the first material layers 35 or the second material layers 36 of the stack structure ST may be replaced by third material layers 45. For example, when the first material layers 35 are sacrificial layers and the second material layers 36 are insulating layers, the first material layers 35 may be replaced by the third material layers 45 that are conductive layers. A memory layer (e.g., charge blocking layer) may additionally be formed before the third material layers 45 (that is, conductive layers) are formed. In another example, when the first material layers 35 are conductive layers and the second material layers 36 are insulating layers, the first material layers 35 may be silicided. In another example, when the first material layers 35 are conductive layers and the second material layers 36 are sacrificial layers, the second material layers 36 may be replaced by the third material layers 45 that are insulating layers.

However, the first material layers 35 or the second material layers 36 may be replaced by the third material layers 45, right after the slit SL is formed. In other words, the spacer 41 may be formed after the first material layer 35 or the second material layers 36 are replaced by the third material layers 45 through the slit SL. In addition, the number and kinds of layers included in the sacrificial structure 32 may be changed.

After the spacer 41 is removed, the second source layer 44 may be additionally doped with impurities. For example, n type impurities may be additionally doped using an ion implantation process.

In addition, a heat treatment process may be performed so that the impurities included in the second source layer 44 may be diffused into the first source layer 33 and the first contact pattern 42A. In addition, the impurities may be diffused into the semiconductor layer 39 contacting the first contact pattern 42A, and an area into which the impurities are diffused may serve as a junction. However, since the well plate 31 and the second contact pattern 42B are separated from the second source layer 44 by the isolation pattern 43, the impurities may be diffused into the well plate 31 and the second contact pattern 42B.

Subsequently, after an insulating spacer 46 is formed on an inner wall of the slit SL, a junction 47 may be formed on the second source layer 44 exposed on a lower surface of the slit SL. For example, the junction 47 may be formed by an ion implantation process. The junction 47 may be titanium silicide (TiSix) layer. Subsequently, a source pickup line 48 may be formed in the slit SL. The source pickup line 48 may directly contact the second source layer 44 and be electrically coupled to the first source layer 33 and the first contact pattern 42A through the second source layer 44.

As described above, the isolation pattern 43, the first contact pattern 42A, and the second contact pattern 42B may be easily formed by partially oxidizing the contact layer 42.

FIGS. 4A to 4D are cross-sectional views illustrating a method of manufacturing a semiconductor device according to an embodiment of the invention. Hereinafter, processes subsequent to FIG. 3 as described above will be described. A detailed description of the earlier processes will be omitted since these processes are the same as described above with reference to FIGS. 3A to 3E.

Figure 4A:
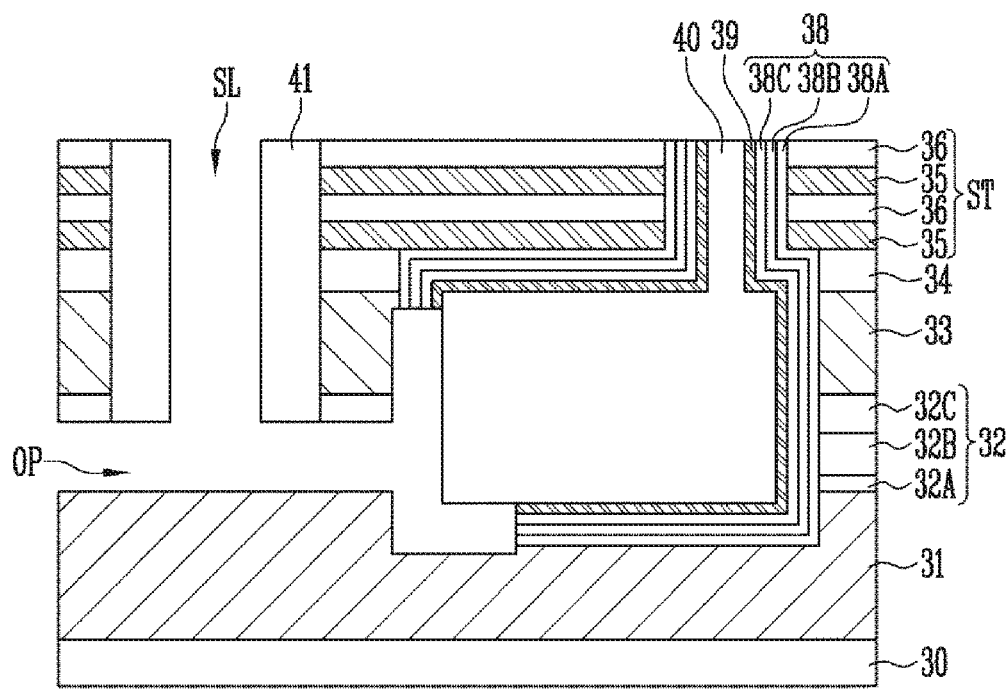
FIGS. 4A to 4D are cross-sectional diagrams illustrating a method of manufacturing a semiconductor device according to an embodiment of the present invention.

Referring to FIG. 4A, the semiconductor layer 39 exposed through the opening OP may be removed, so that a portion of the semiconductor layer 39 that is exposed by the memory layer 38 may be removed. In addition, a portion of the gap-filling insulating layer 40 may be exposed.

Figure 4B:
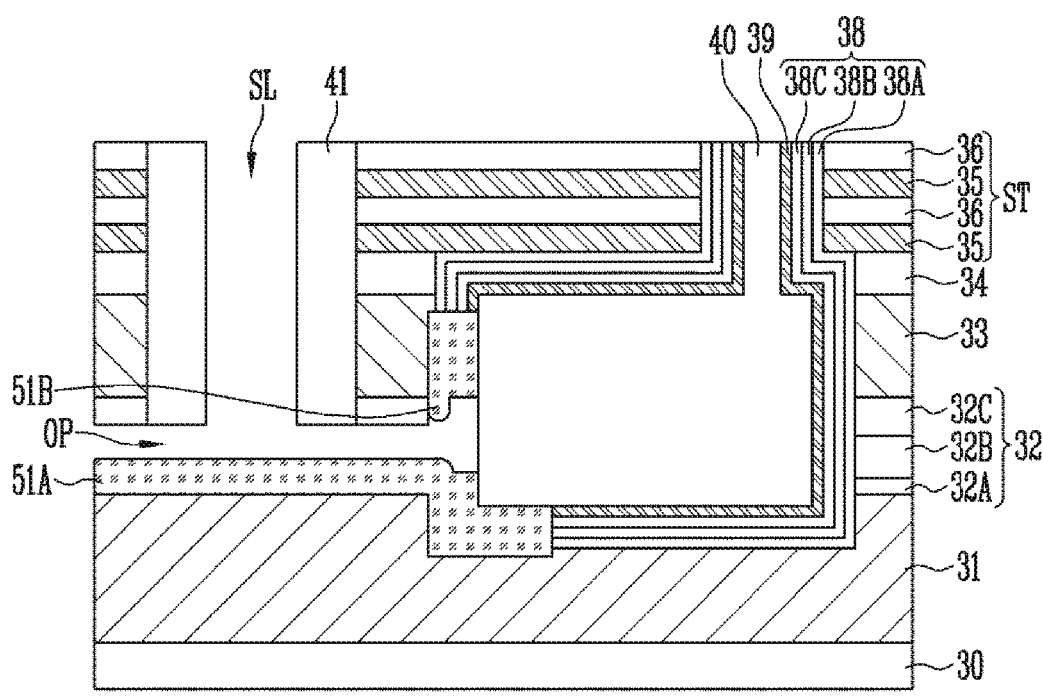

Referring to FIG. 4B, first and second contact layers 51A and 51B may be formed in the opening OP. For example, the first and second contact layers 51A and 51B may be selectively grown from the first source layer 33, the semiconductor layer 39, and the well plate 31 exposed through the opening OP. The first and second contact layers 51A and 51B may be undoped polysilicon layers.

Since a sidewall of the gap-filling insulating layer 40 exposed by removing the semiconductor layer 39 does not function as a seed, a contact layer may not be formed on a portion of the sidewall of the gap-filling insulating layer 40. Therefore, the first contact layer 51A may be formed on the surface of the well plate 31, and between the well plate 31 and the gap-filling insulating layer 40. The second contact layer 51B may be formed between the first source layer 33 and the gap-filling insulating layer 40. In addition, the first and second contact layers 51A and 51B may be separated from each other.

Figure 4C:
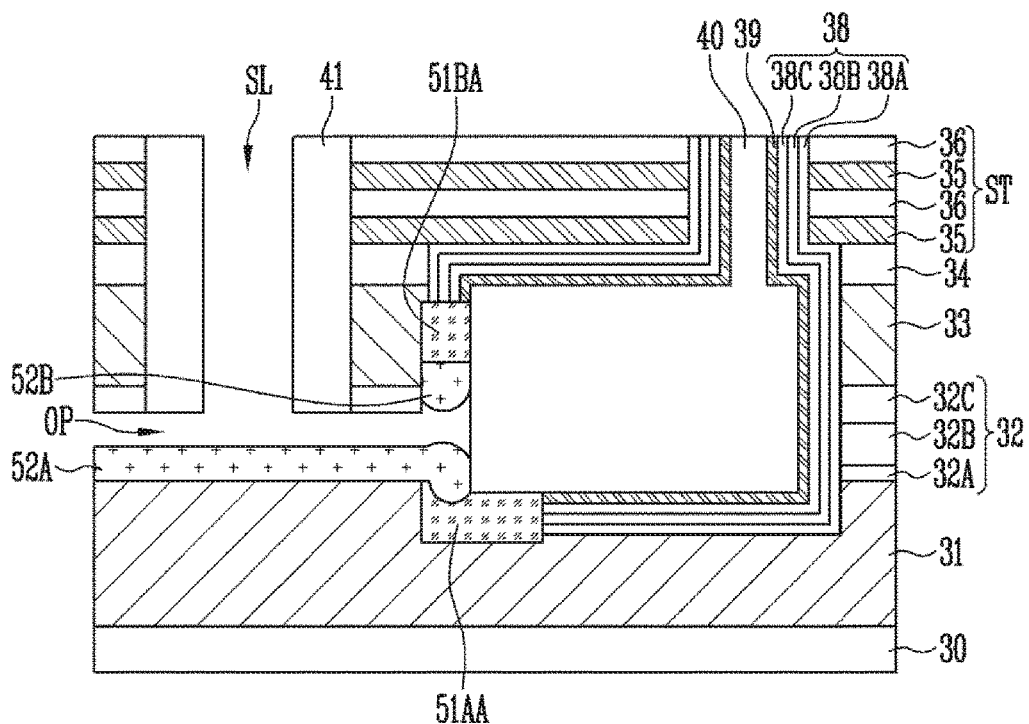

Referring to FIG. 4C, the first and second contact layers 51A and 51B may be oxidized to form first and second isolation patterns 52A and 52B, respectively. The first isolation patterns 52A may be formed on an upper part of the well plate 31, and the second isolation patterns 52B may contact a portion of a sidewall of the gap-filling insulating layer 40. In addition, a portion of the first contact layer 51A that remains not oxidized may be a first contact pattern 51AA, and a portion of the second contact layer 51B that remains not oxidized may be a second contact pattern 51BA.

Figure 4D:
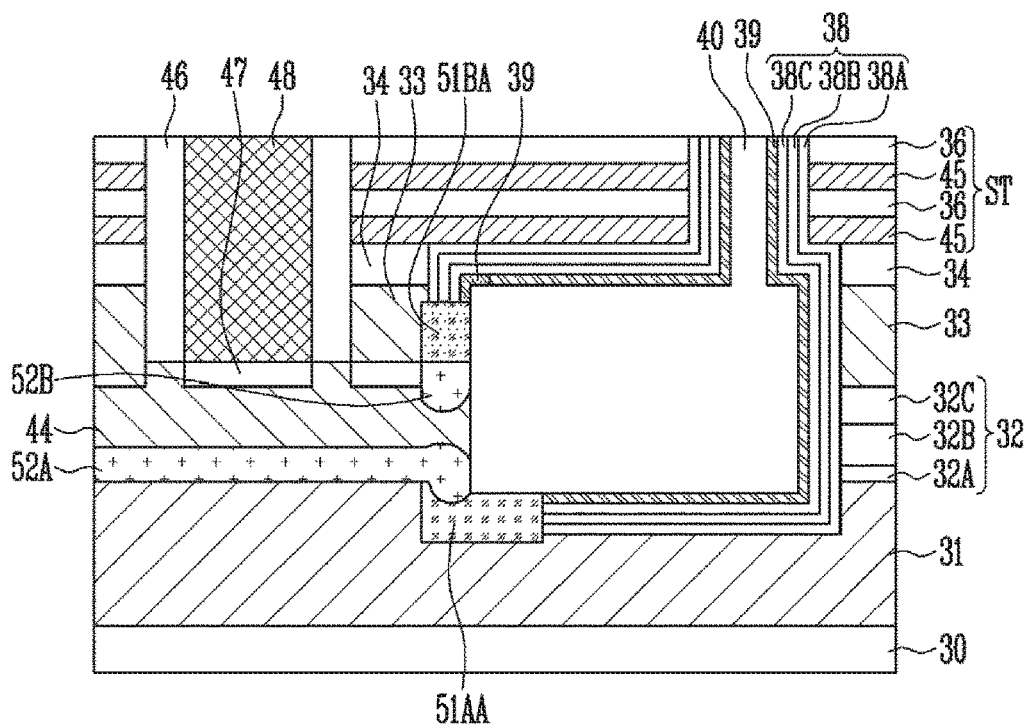

Referring to FIG. 4D, the second source layer 44 may be formed in the opening OP after the remaining third sacrificial layer 32C is removed. Subsequently, the first material layers 35 or the second material layers 36 may be replaced by the third material layers 45, and the insulating spacer 46, the junction 47, and the source pickup line 48 may be formed. A detailed description of processes will be omitted since they are the same processes as described above.

According to the above-described manufacturing method, the first contact layer 51A coupled to the well plate 31 and the second contact layer 51B coupled to the first source layer 33 may be separated from each other. Therefore, the first contact pattern 51AA and the second contact pattern 51BA may be more easily spaced apart from each other.

FIGS. 5A to 5F are cross-sectional diagrams illustrating a method of manufacturing a semiconductor device according to an embodiment of the invention. Hereinafter, processes subsequent to FIG. 3C described above will be described below. Since the earlier processes are the same as described above with reference to FIGS. 3A to 3C, a detailed description thereof will be omitted.

Figure 5A:
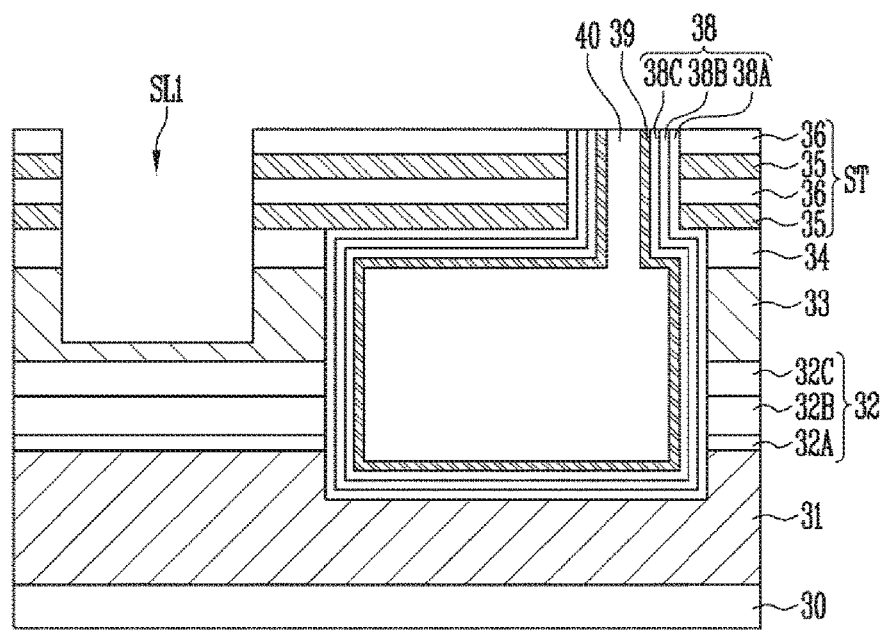
FIGS. 5A to 5F are cross-sectional diagrams illustrating a method of manufacturing a semiconductor device according to an embodiment of the present invention.

Referring to FIG. 5A, a first slit SL1 may be formed so that the first slit SL1 may pass through the stacked structure ST and the interlayer insulating layer 34, exposing the first source layer 33. The first slit SL1 may partially pass through the first source layer 33.

Figure 5B:
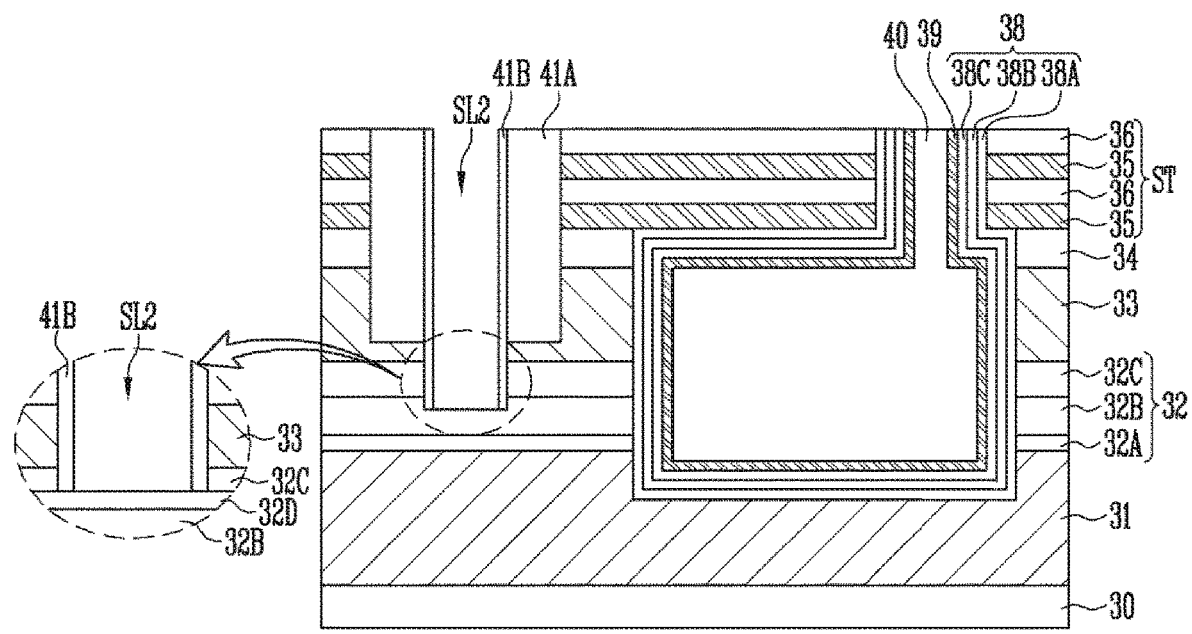

Referring to FIG. 5B, after a first spacer 41A is formed on an inner wall of the first slit SL1, a lower layer may be etched using the first spacer 41A as an etch barrier to form a second slit SL2. For example, the second slit SL2 may have a depth by which the second slit SL2 may pass through the first source layer 33 and the third sacrificial layer 32C to expose the second sacrificial layer 32B. Subsequently, a second spacer 41B may be formed on an inner wall of the second slit SL2. The first and second spacers 41A and 41B may include a material having high etch selectivity compared to the first and second sacrificial layers 32A and 32B, respectively. For example, the first sacrificial layer 32A may be an oxide layer, the second sacrificial layer 32B may be a polysilicon layer, and the first and second spacers 41A and 41B may be nitride layers.

A sacrificial layer 32D may be further formed between the second sacrificial layer 32B and the third sacrificial layer 32C. The sacrificial layer 32D may include a material having high etch selectivity compared to the first spacer 41A. For example, the first spacer 41A may be a nitride layer and the sacrificial layer 32D may be an oxide layer. The second slit SL2 may be formed using the sacrificial layer 32D as an etch stop layer.

Figure 5C:
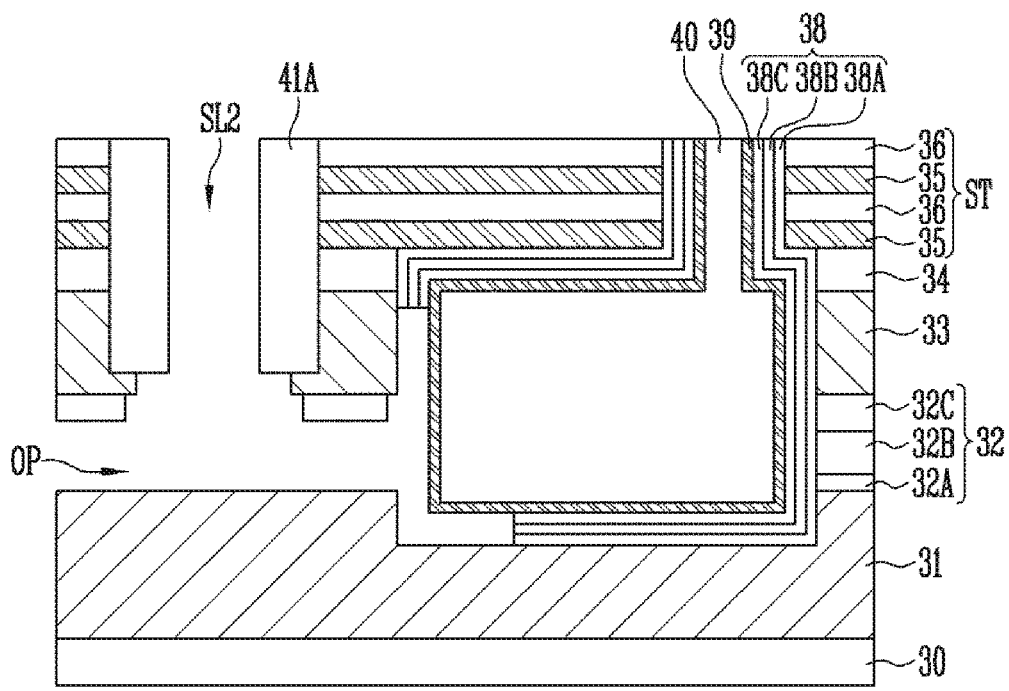

Referring to FIG. 5C, the opening OP may be formed by removing the second sacrificial layer 32B through the second slit SL2. Subsequently, the memory layer 38 exposed through the opening OP may be removed. The first sacrificial layer 32A may also be removed when the memory layer 38 is removed, so that the well plate 31 may be exposed through the opening OP. When the memory layer 38 is removed, the first source layer 33 and the third sacrificial layer 32C may be partially removed, and the second spacer 41B may be completely removed. The first spacer 41A, the first source layer 33, and the third sacrificial layer 32C may have a stepped structure at a position where the second slit SL2 and the opening OP are coupled to each other.

Figure 5D:
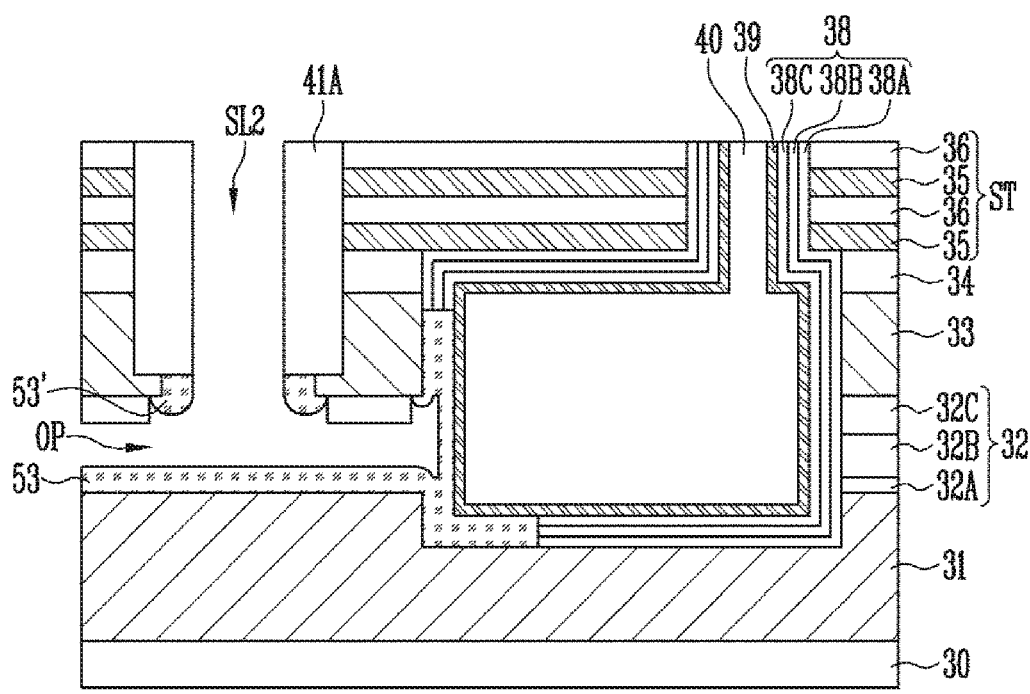

Referring to FIG. 5D, a contact layer 53 may be grown from the first source layer 33, while the semiconductor layer 39 and the well plate 31 are exposed through the opening OP. A contact layer 53' may be grown from the first source layer 33 between the first spacer 41A and the third sacrificial layer 32C.

Figure 5E:
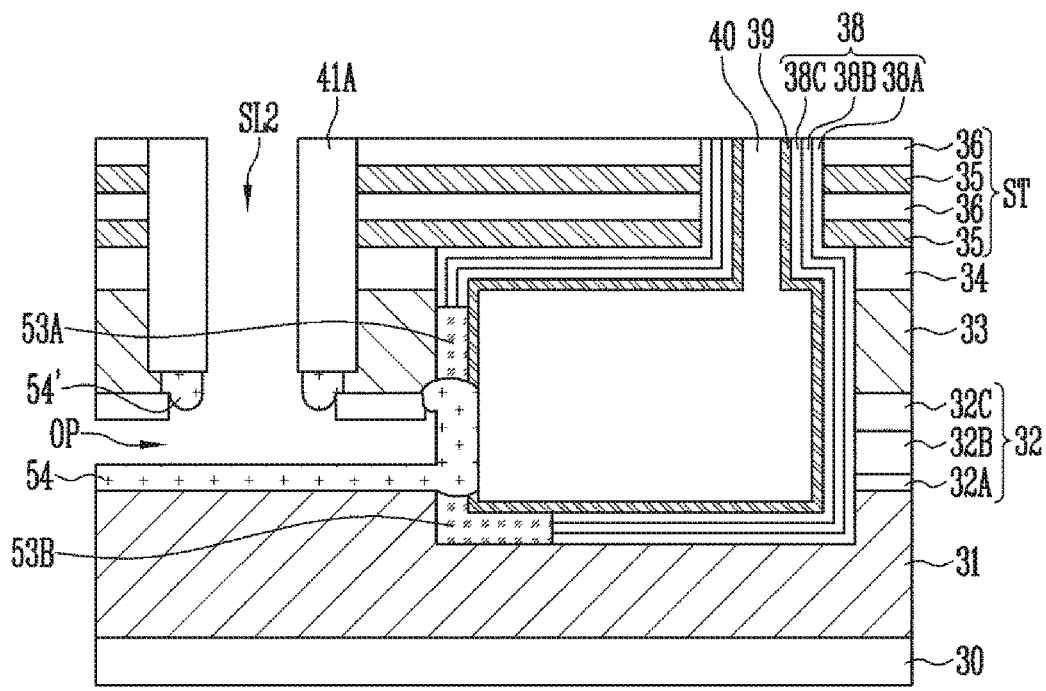

Referring to FIG. 5E, first and second isolation patterns 54 and 54' may be formed by oxidizing the contact layers 53 and 53', respectively. The second isolation pattern 54' may be formed at the same time as the first isolation pattern 54 is formed. Portions of the contact layer 53 that remain not oxidized may be first and second contact layers 53A and 53B. The first and second contact layers 53A and 53B may be separated from each other by the first isolation patterns 54.

Figure 5F:
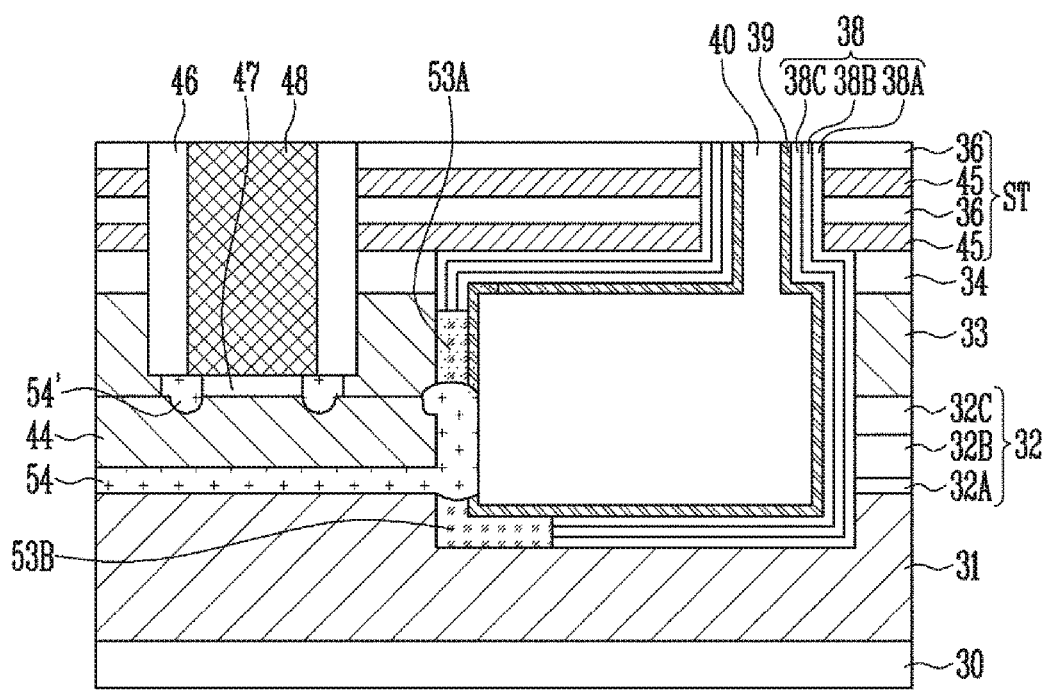

Referring to FIG. 5F, after the remaining third sacrificial layer 32C is removed, the second source layer 44 may be formed in the opening OP. Subsequently, the first material layers 35 or the second material layers 36 may be replaced by the third material layers 45, and an insulating spacer 46, a junction 47, and a source pickup line 48 may be formed. A detailed description of processes will be omitted since they are the same processes as described above.

FIGS. 6A to 6E are cross-sectional diagrams illustrating a method of manufacturing a semiconductor device according to an embodiment of the present invention. Hereinafter, processes subsequent to FIG. 5C as described above will be described below. A detailed description of the previous processes will be omitted since they are the same processes as described above with reference to FIGS. 5A to 5C.

Figure 6A:
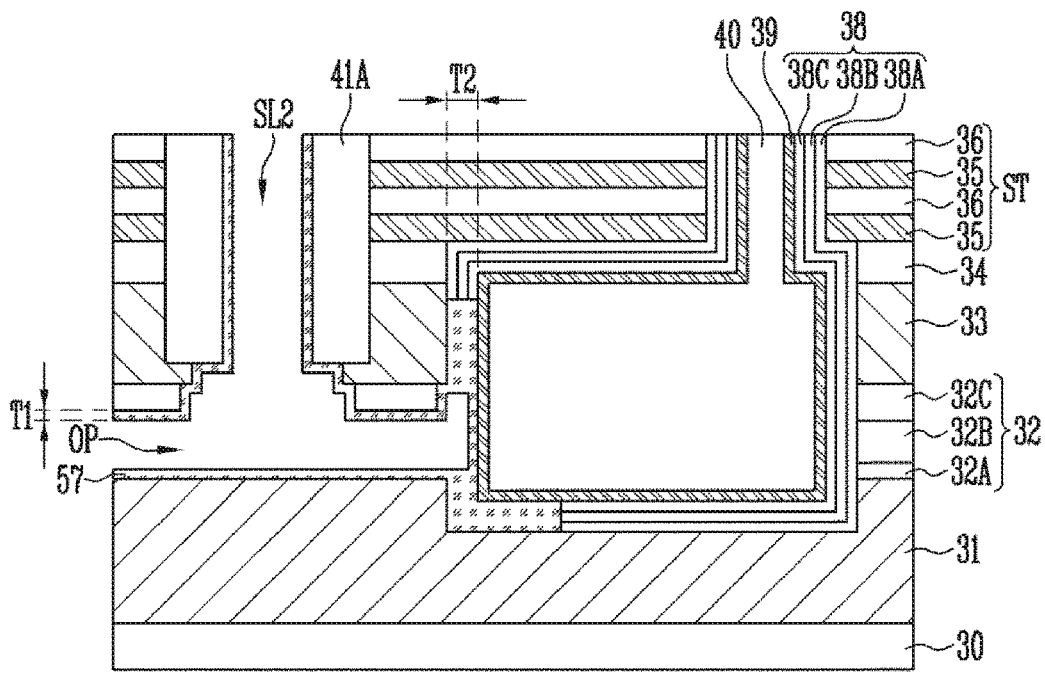
FIGS. 6A to 6E are cross-sectional diagrams illustrating a method of manufacturing a semiconductor device according to an embodiment of the present invention.

Referring to FIG. 6A, a contact layer 57 may be deposited in the opening OP. The contact layer 57 may be deposited on an inner surface of the opening OP and an inner surface of the slit SL. The contact layer 57 may be an undoped polysilicon layer. In addition, the contact layer 57 may have a thickness T1 corresponding to ½ or more than ½ of a width T2 of a region where the first and second contact patterns are to be formed. In other words, the contact layer 57 may have the thickness T1 corresponding to ½ or more than ½ of the thickness T2 of the memory layer 38.

Figure 6B:
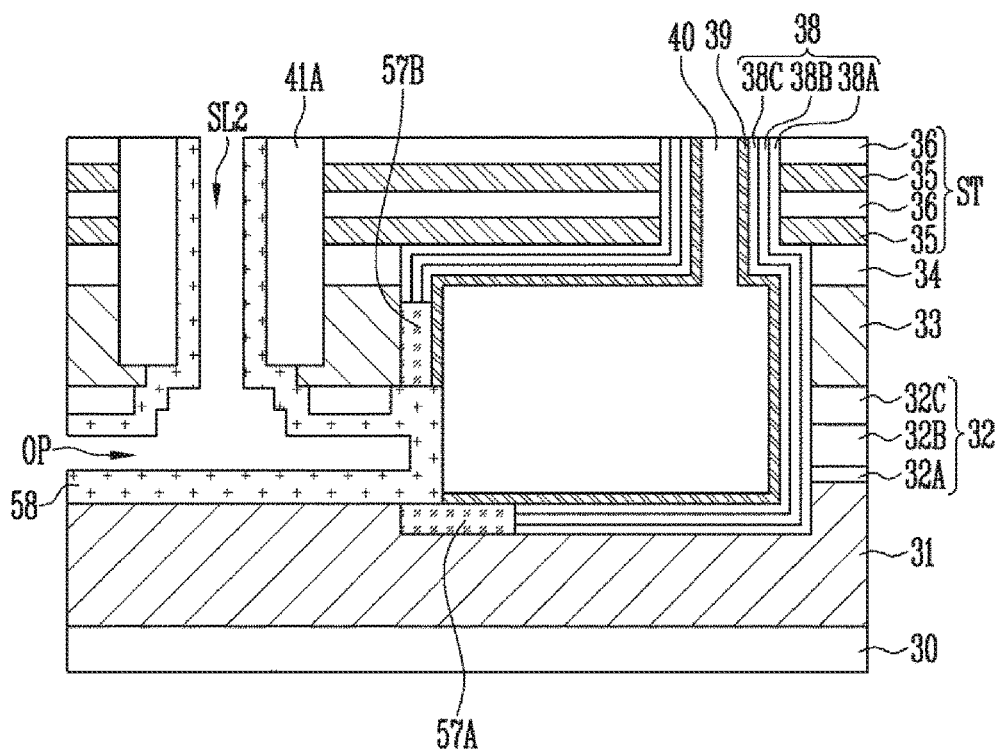

Referring to FIG. 6B, the contact layer 57 may be partially oxidized to form an oxide layer 58. An oxidation process may be performed such that only the contact layer 57 is oxidized and the semiconductor layer 39 contacting the contact layer 57 is not oxidized, or such that both the contact layer 57 and the semiconductor layer 39 contacting the contact layer 57 may be oxidized.

By the oxidization process, portions of the contact layer 57 that are exposed through the opening OP and the second slit SL2 may be oxidized. In addition, a portion of the contact layer 57 that are inserted between the semiconductor layer 39 and the first source layer 33 without being oxidized may be a second contact layer 57B. A portion of the contact layer 57 that is inserted between the well plate 31 and the semiconductor layer 39 without being oxidized may be a first contact layer 57A.

Figure 6C:
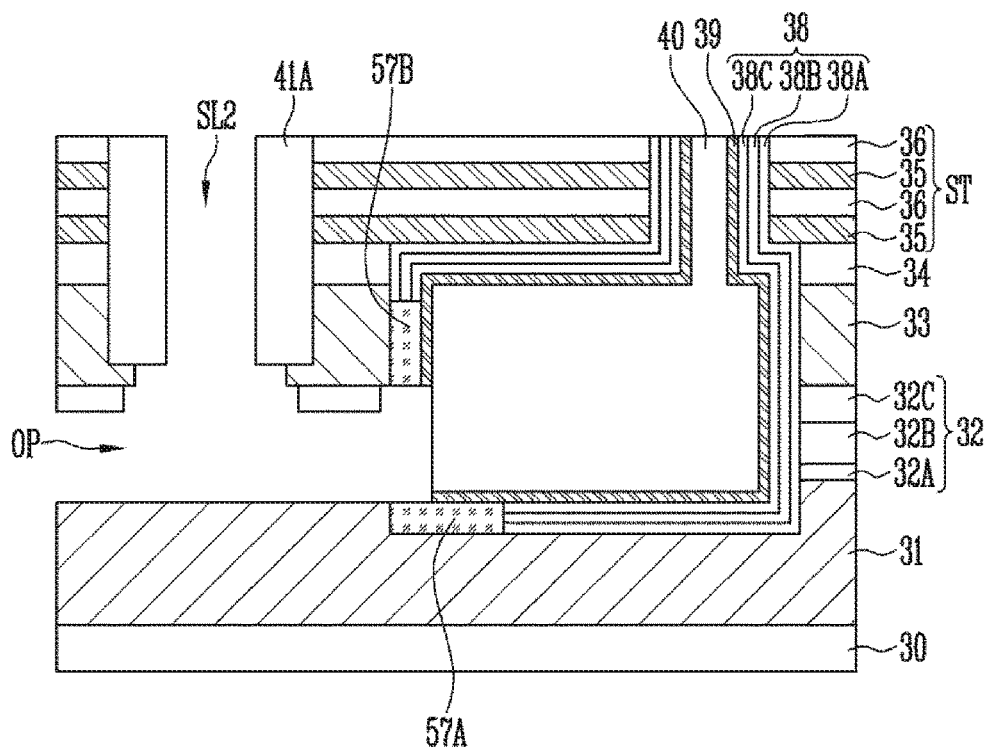

Referring to FIG. 6C, the oxide layer 58 may be removed. For example, the oxide layer 58 may be selectively etched using a wet etch process. According to the present embodiment, as shown in FIG. 6C, the oxide layer 58 may be completely removed to expose the first contact layer 57A and the second contact layer 57B. However, the present invention is not limited thereto, and the oxide layer 58 may be partially or completely removed.

Figure 6D:
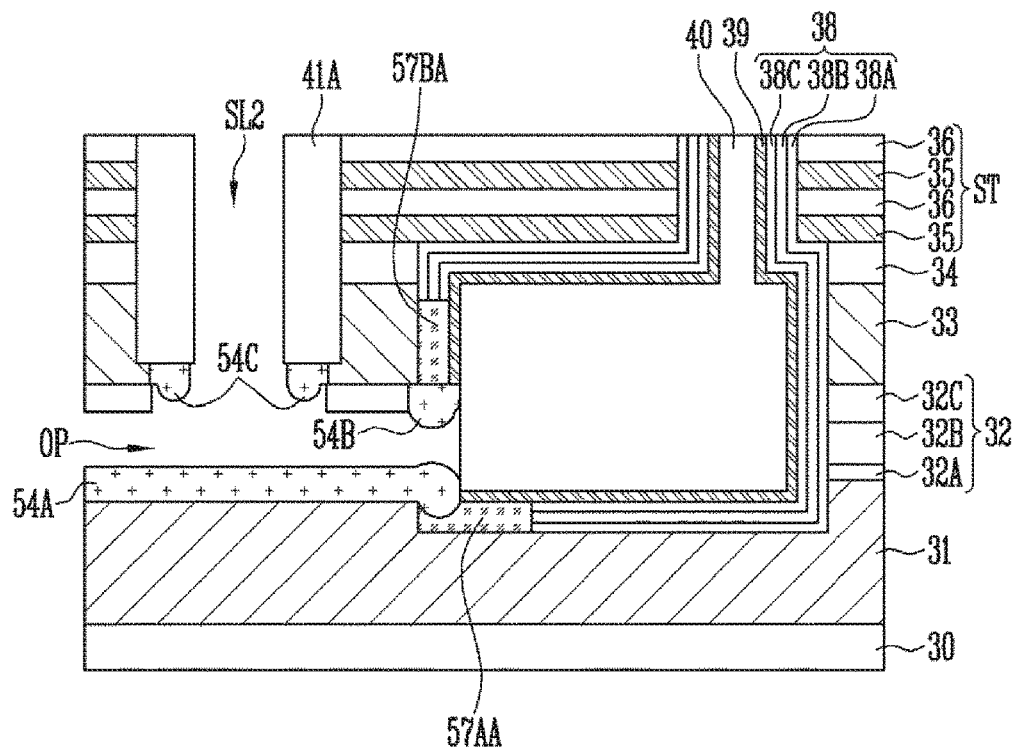

Referring to FIG. 6D, first and second isolation patterns 54A and 54B may be formed by oxidizing the first and second contact layers 57A and 57B, respectively. When the first source layer 33 is exposed between the first spacer 41A and the second sacrificial layer 32C, the exposed first source layer 33 may be partially oxidized to form a third isolation pattern 54C.

An area of the first contact layer 57A that remains not oxidized may be a first contact pattern 57AA, and a portion of the second contact layer 57B that remains not oxidized may be a second contact pattern 57BA. The first isolation pattern 54A may be formed on an upper part of the well plate 31 to cover the first contact pattern 57AA. In addition, the second isolation pattern 54B may contact a portion of a sidewall of the gap-fining insulating layer 40 and cover the second contact pattern 57BA.

Figure 6E:
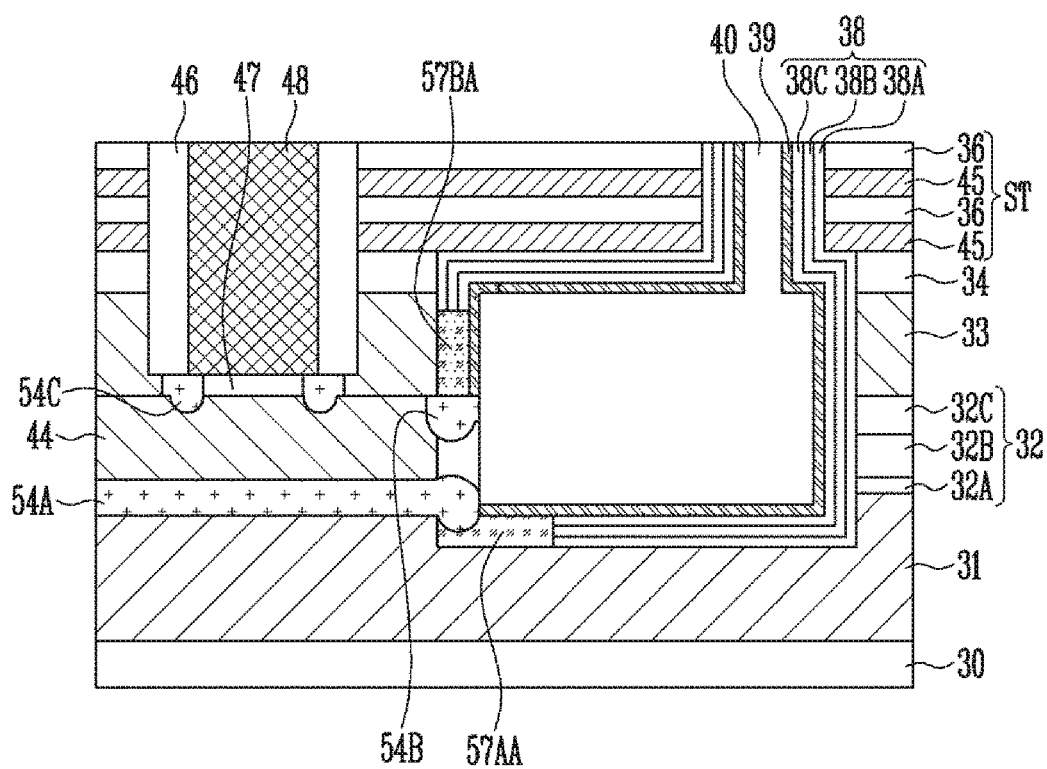

Referring to FIG. 6E, after the remaining third sacrificial layer 32C is removed, the second source layer 44 may be formed in the opening OP. Subsequently, the first material layers 35 or the second material layers 36 may be replaced by the third material layers 45, and the insulating spacer 46, the junction 47 and the source pickup line 48 may be formed. A detailed description of processes is omitted since they are the same processes as described above.

The above-described embodiments with reference to FIG. 6A to 6E may be modified according to the thickness of the oxide layer 58 and a range within which the oxide layer 58 is removed. The oxide layer 58 shown in FIG. 6C may be partially removed so as not to expose the first contact layer 57A, the second contact layer 57B, and the well plate 31. For example, an etch process may be performed such that a portion of the oxide layer 58 that is formed in the second slit SL2 may be removed. Since the oxide layer 58 remaining on the first contact layer 57A, the second contact layer 57B, and the well plate 31 function as isolation patterns, the oxidization process of FIG. 6D may be omitted.

According to the above-described manufacturing method with reference to FIG. 6A to 6E, the contact layer 57 may be formed using a deposition process.

Figure 7A:
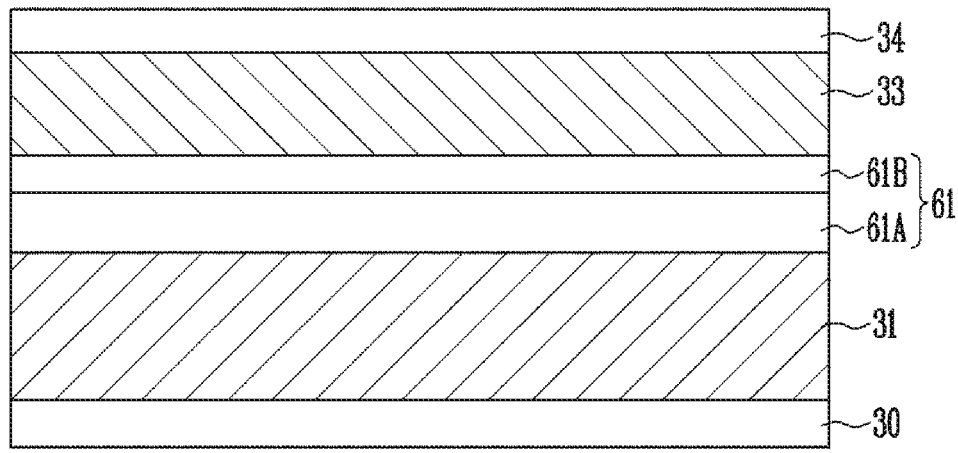
FIGS. 7A to 7C are cross-sectional diagrams illustrating a method of manufacturing a semiconductor device according to an embodiment of the present invention.
Figure 7B:
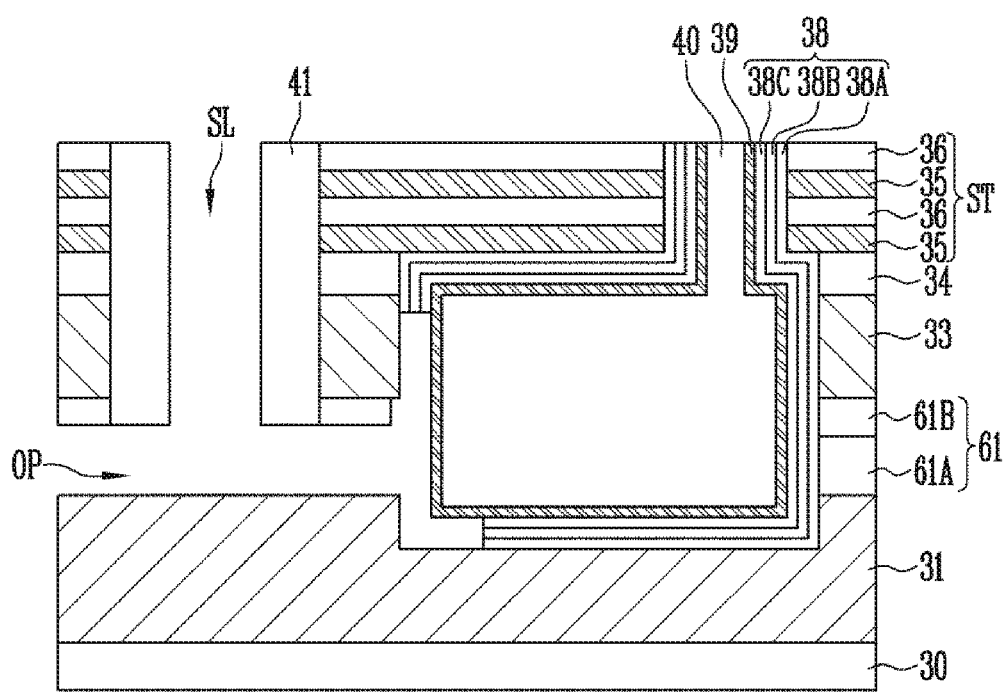
Figure 7C:
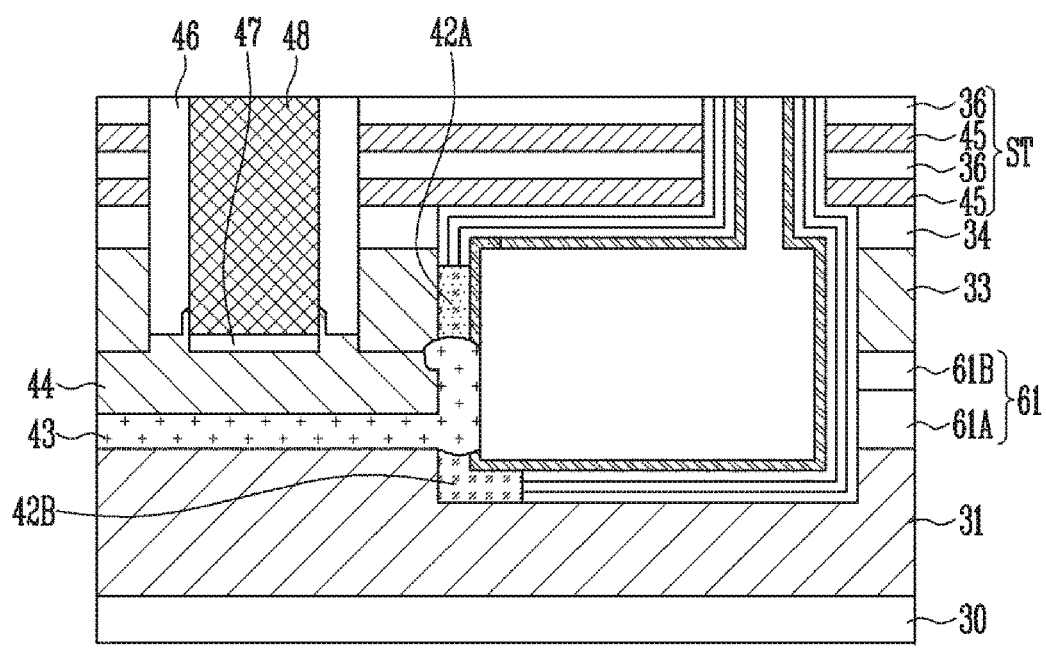

FIGS. 7A to 7C are cross-sectional diagrams illustrating a method of manufacturing a semiconductor device according to an embodiment of the present invention. Hereinafter, a description of common contents with earlier described embodiments is omitted.

Referring to FIG. 7A, the well plate 31, a sacrificial structure 61, the first source layer 33, and the interlayer insulating layer 34 may be sequentially formed on the substrate 30. The sacrificial structure 61 may be a multilayer film and include first and second sacrificial layers 61A and 61B. The first sacrificial layer 61A may include a material having high etch selectivity compared to the second sacrificial layer 61B. For example, the first sacrificial layer 61A may be an oxide layer and the second sacrificial layer 61B may be a nitride layer. In addition, the first sacrificial layer 61A may be an oxide layer having a relatively high wet etch rate, and the interlayer insulating layer 34 may be an oxide layer having a relatively low wet etch rate.

Referring to FIG. 7B, the memory layer 38, the semiconductor layer 39, and the gap-filling insulating layer 40 may be formed. Subsequently, the slit SL may be formed so that the first sacrificial layer 61A may be exposed therethrough. The slit SL may have a depth at which the slit SL may pass through the stacked structure ST, the interlayer insulating layer 34, the first source layer 33, and the second sacrificial layer 61B, exposing the first sacrificial layer 61A. As described above with reference to FIGS. 5A and 5B, after a first slit is formed to a depth at which the first source layer 33 is exposed, a second slit may be formed by performing an additional etch process to expose the first sacrificial layer 61B.

Subsequently, after the spacer 41 is formed on an inner wall of the slit SL, the first sacrificial layer 61A may be removed, so that the well plate 31 may be exposed through the opening OP. Then, the memory layer 38 may be removed to expose the semiconductor layer 39. However, the semiconductor layer 39 exposed through the opening OP may be removed as described above with reference to FIGS. 4A to 4D.

Referring to FIG. 7C, after a contact layer is formed on the first source layer 33, the semiconductor layer 39, and the well plate 31 exposed through the opening OP, the contact layer may be oxidized to form the isolation pattern 43, the first contact pattern 42A, and the second contact pattern 42B. Subsequently, the second source layer 44, the insulating spacer 46, the junction 47, and the source pickup line 48 may be formed. A detailed description of processes is omitted since they are the same processes as described above.

According to the above-described manufacturing method with reference to FIG. 7A to 7C, a support body may remain between or in the connection structures. The support body may have a stacked structure in which the first sacrificial layer 61A, the second sacrificial layer 61B, the first source layer 33, and interlayer insulating layer 34 are stacked.

FIGS. 8A to 8H are cross-sectional diagrams illustrating a semiconductor device according to an embodiment of the present invention. Hereinafter, a description of common contents with earlier described embodiments is omitted.

Figure 8A:
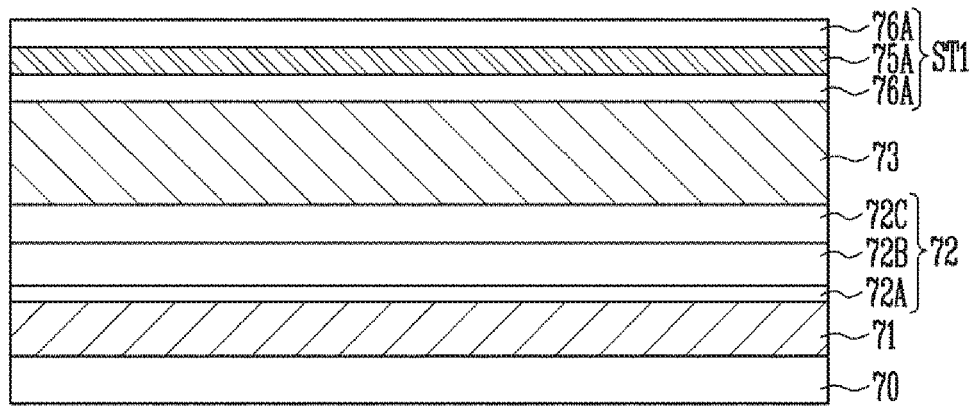
FIGS. 8A to 8H are cross-sectional diagrams illustrating a method of manufacturing a semiconductor device according to an embodiment of the present invention.

Referring to FIG. 8A, a well plate 71, a sacrificial structure 72, and a first source layer 73 may be sequentially formed on a substrate 70. The sacrificial structure 72 may include first to third sacrificial layers 72A to 72C. As described above with reference to FIG. 6A, the sacrificial structure 72 may include a first sacrificial layer and a second sacrificial layer.

Subsequently, the first stacked structure ST1 may be formed on the first source layer 73.

Figure 8B:
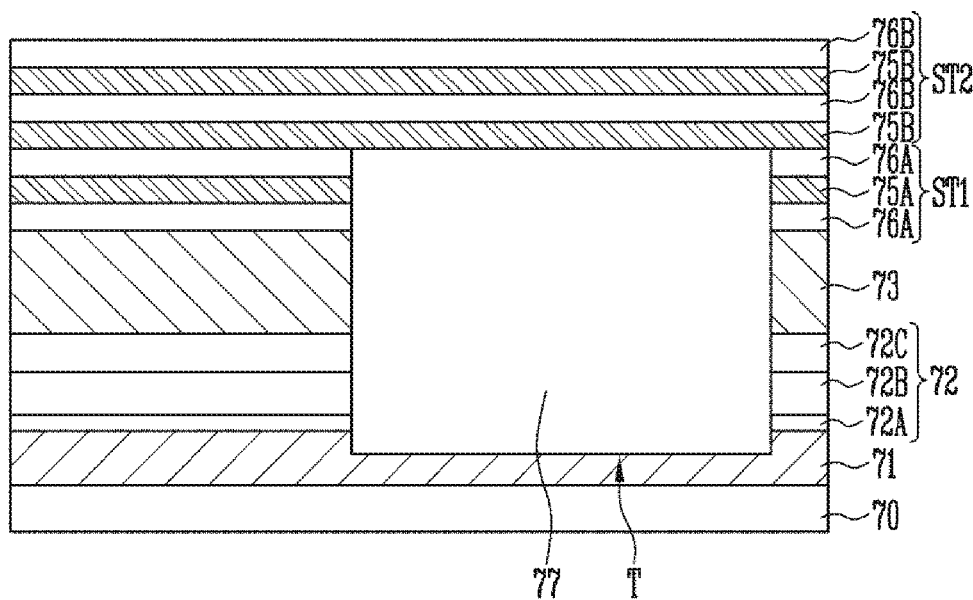

Referring to FIG. 8B, the trench T may be formed in a first stacked structure ST1, the first source layer 73, the sacrificial structure 72 and the well plate 71. For example, after the first stacked structure ST1, the first source layer 73, and the sacrificial structure 72 are etched, the well plate 71 may be partially etched to a predetermined depth to form the trench T.

Subsequently, a fourth sacrificial layer 77 may be formed in the trench T. The fourth sacrificial layer 77 may be a single layer or a multilayer film. The fourth sacrificial layer 77 may be a single layer including a titanium nitride or a tungsten, or a multilayer film including a combination thereof.

Subsequently, a second stacked structure ST2 may be formed on an intermediate resultant on which the fourth sacrificial layer 77 is formed. The second stacked structure ST2 may include first material layers 75B and second material layers 76B stacked alternately with each other. The first material layers 75B may be provided to form gate electrodes of a memory cell and a selection transistor. The second material layers 76B may insulate the stacked gate electrodes from each other. The first material layers 75B may include a material having high etch selectivity compared to the second material layers 76B. For example, the first material layers 75B may be sacrificial layers and the second material layers 76B may be insulating layers. In another example, the first material layers 75B may be conductive layers and the second material layers 76B may be insulating layers. In another example, the first material layers 75B may be conductive layers and the second material layers 76B may be sacrificial layers including undoped polysilicon. In addition, the first material layers 75A and the first material layers 75B may include substantially the same material, and the second material layers 76A and the second material layers 76B may include substantially the same material.

Figure 8C:
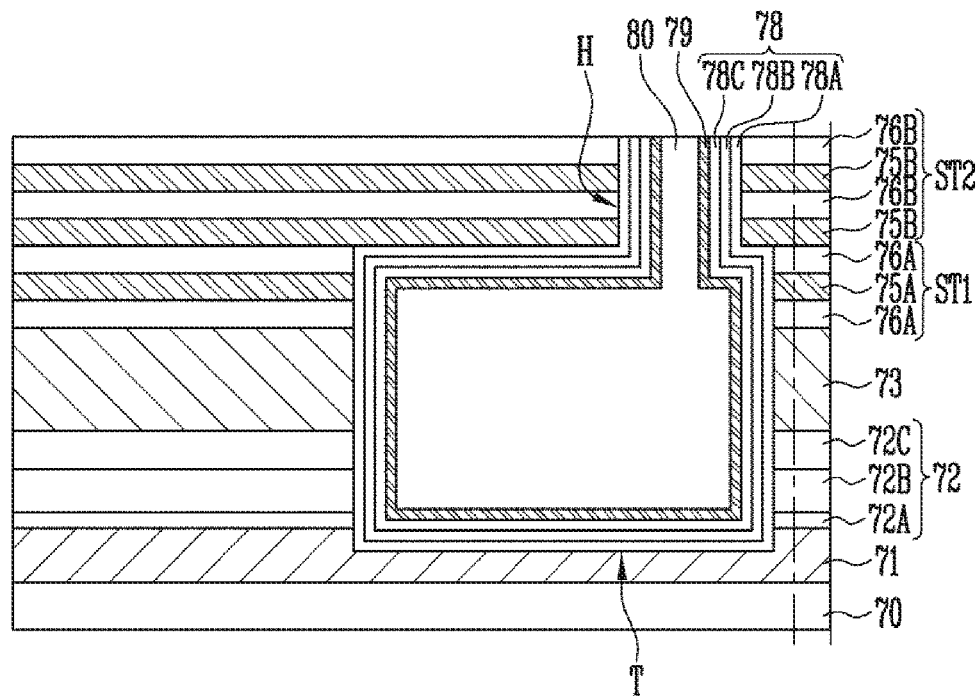

Referring to FIG. 8C, holes H may be formed through the stacked structure ST and connected to the trench T. Subsequently, the fourth sacrificial layer 77 may be removed through the holes H, so that the holes H may be connected integrally the trench T. The remaining first to third sacrificial layers 72A to 72C and the first stacked structure ST1 may function as support bodies, which support the second stacked structure ST2.

Subsequently, a memory layer 78 may be formed in the trench T and the holes H. The memory layer 78 may be formed on inner surfaces of the trench T and the holes H, and surfaces of the support bodies that protrude toward the inside of the trench T. The memory layer 78 may include a charge blocking layer 78A, a data storing layer 78B, and a tunnel insulating layer 78C. Subsequently, after a semiconductor layer 79 is formed in the memory layer 78, a gap-filling insulating layer 80 may be formed in the semiconductor layer 79.

Figure 8D:
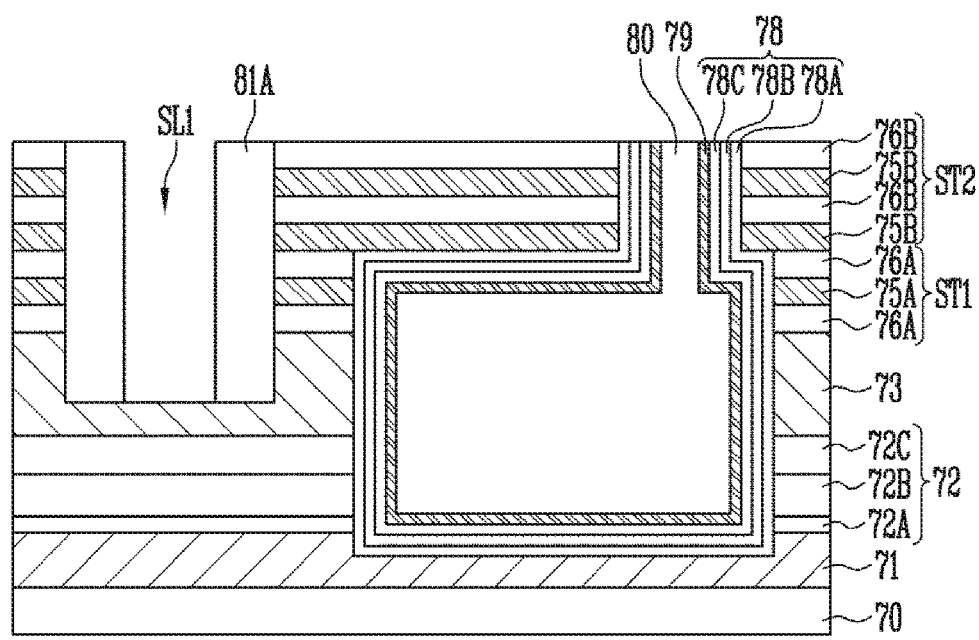

Referring to FIG. 8D, the first slit SL1 may be formed through the second stacked structure ST2 and the first stacked structure ST1, exposing the first source layer 73. Subsequently, a first spacer 81A may be formed on an inner wall of the first slit SL1. The first spacer 81A may include a material having high etch selectivity compared to the first source layer 73 and the second sacrificial layer 72B. For example, when the first source layer 73 and the second sacrificial layer 72B are polysilicon layers, the first spacer 81A may be a nitride layer.

Figure 8E:
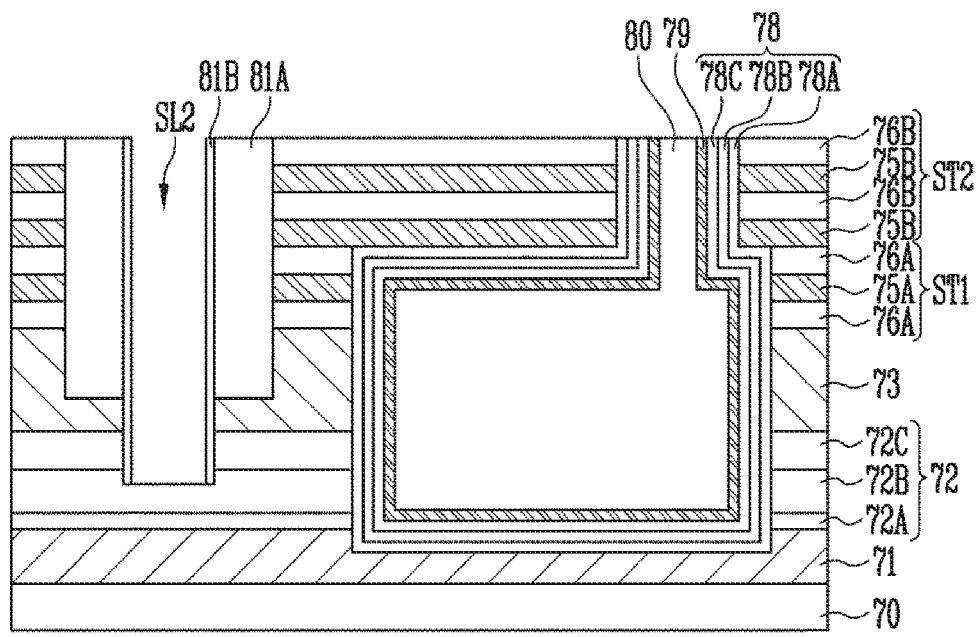

Referring to FIG. 8E, a lower layer may be etched using the first spacer 81A as an etch barrier to form the second slit SL2. For example, the first source layer 73, the third sacrificial layer 72C, and the second sacrificial layer 72B exposed through a bottom surface of the first slit SL1 may be etched. As a result, the second slit SL2 may be formed through the second stacked structure ST2, the first stacked structure ST1, the first source layer 73, and the third sacrificial layer 72C, exposing the second sacrificial layer 72B.

Subsequently, a second spacer 81B may be formed on an inner wall of the second slit SL2. The second spacer 81B may include a material having high etch selectivity compared to the second sacrificial layer 72B. For example, when the second sacrificial layer 72B is a polysilicon layer, the second spacer 81B may be a nitride layer.

As described above with reference to the various embodiments, the depth of the second slit SL2 and the manufacturing method thereof may be changed in various manners. The second slit SL2 may be formed by two steps or by a single step. For example, the first slit SL1 may be deep enough to expose the second sacrificial layer 72B or the third sacrificial layer 72C, and the processes of forming the second slit SL2 and the second spacer 81B may be omitted.

Figure 8F:
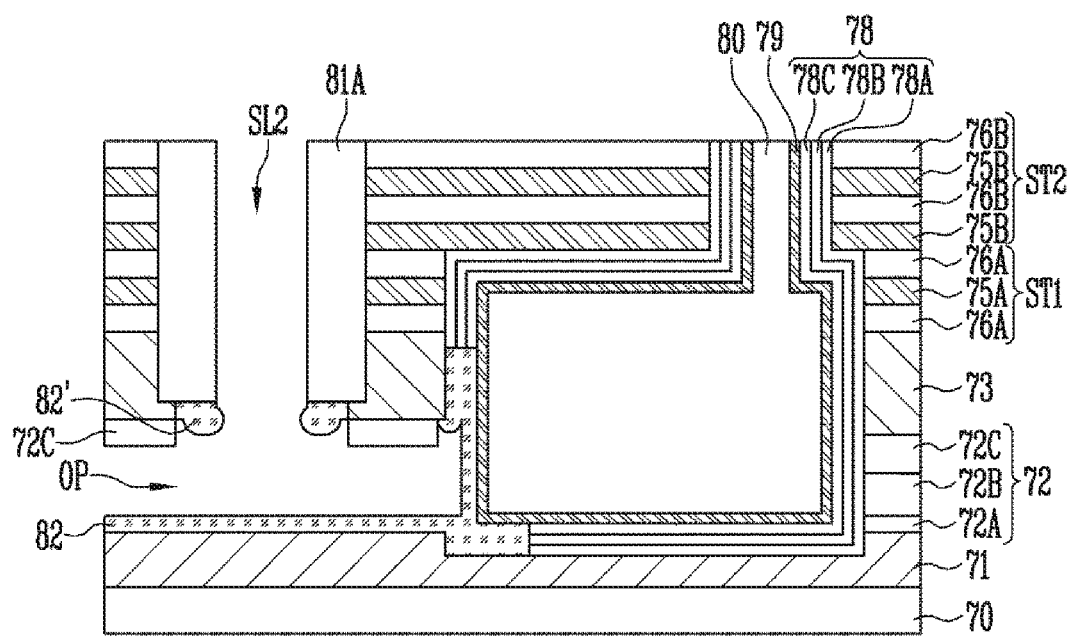

Referring to FIG. 8F, the opening OP may be formed by removing the second sacrificial layer 72B through the second slit SL2. Subsequently, the semiconductor layer 79 may be exposed by removing a portion of the memory layer 78 exposed through the opening OP. When the memory layer 78 is removed, the first sacrificial layer 72A may be exposed and the third sacrificial layer 72C may be partially removed. In addition, when the memory layer 78 is removed, the second spacer 81B may be removed and the first spacer 81A may be partially removed.

Subsequently, a contact layer 82 may be formed on the semiconductor layer 79, the first source layer 73, and the well plate 71 exposed through the opening OP. A contact layer 82' may be formed on the first source layer 73 exposed between the first spacer 81A and the remaining third sacrificial layer 72C.

Figure 8G:
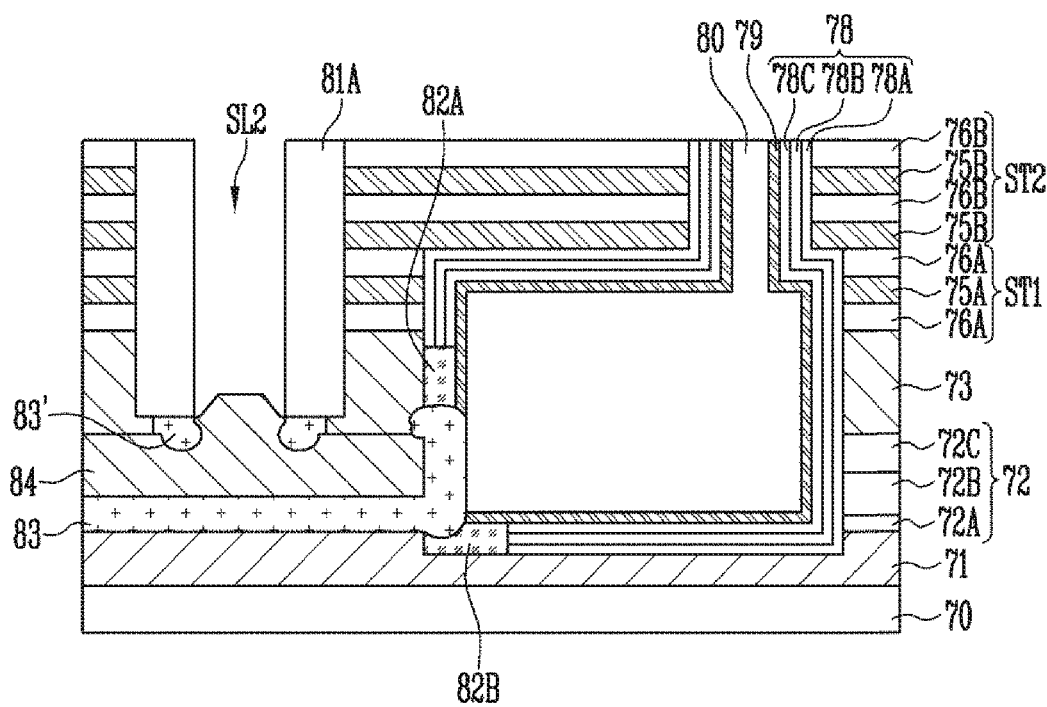

Referring to FIG. 8G, the contact layer 82 may be partially oxidized to form an isolation pattern 83. The contact layer 82' may be oxidized to form an isolation pattern 83' under the first spacer 81A. In addition, portions of the contact layer that are not oxidized may be first and second contact patterns 82A and 82B.

After the remaining third sacrificial layer 72C is removed, a second source layer 84 may be formed in the opening OP. For example, a polysilicon layer may be grown from the first source layer 73 exposed through the opening OP to form the second source layer 84.

Figure 8H:
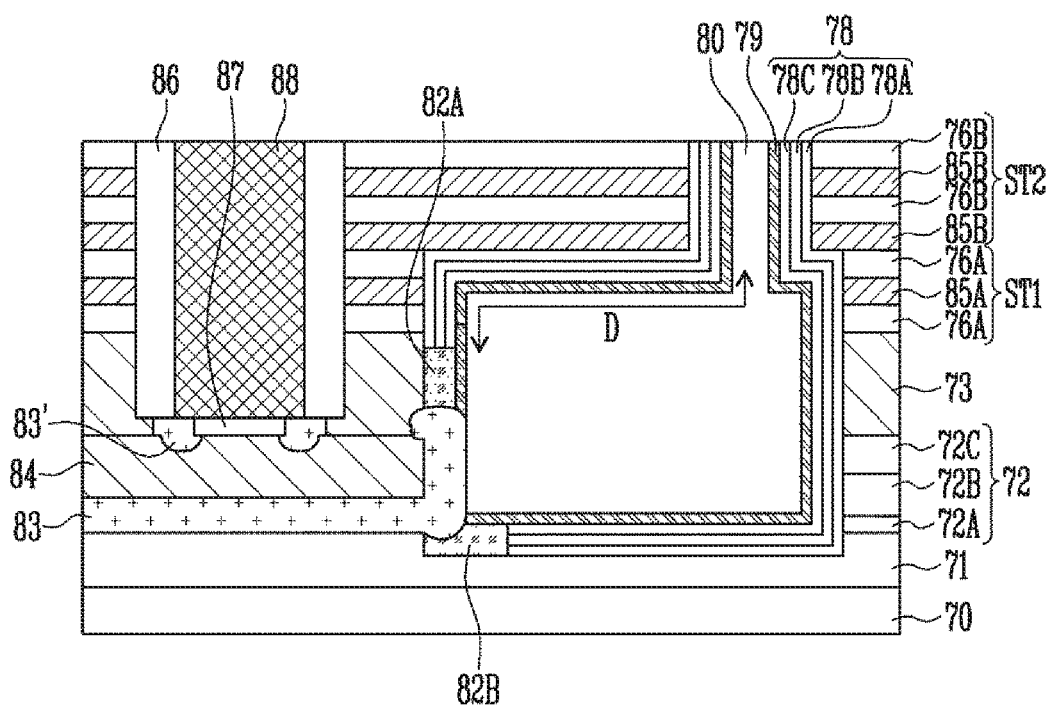

Referring to FIG. 8H, after the remaining first spacer 81A is removed, the first material layers 75A and 75B or the second material layers 76A and 76B may be replaced by third material layers 85A and 85B, respectively. For example, when the first material layers 75A and 75B are sacrificial layers and the second material layers 76A and 76B are insulating layers, the first material layers 75A and 75B may be replaced by the third material layers 85A and 85B that are conductive layers. In another example, when the first material layers 75A and 75B are conductive layers and the second material layers 76A and 76B are insulating layers, the first material layers 75A and 75B may be silicided. In another example, when the first material layers 75A and 75B are conductive layers and the second material layers 76A and 76B are sacrificial layers, the second material layers 76A and 76B may be replaced by third material layers 85A and 85B that are insulating layers.

When the third material layers 85A and 85B are conductive layers, conductive layers (85A) overlapping the connection structure may be dummy gate electrodes. In other words, when the semiconductor device is driven, a bias may be applied to the conductive layers (85A), which may operate as transistor. However, the corresponding transistor may function as a dummy transistor.

In addition, by performing a heat treatment process, the impurities included in the second source layer 84 may be diffused into the first source layer 73 and the first contact patterns 82A. The impurities may be diffused into the semiconductor layer 79 contacting the first contact patterns 82A, and the area into which the impurities are diffused may be adjacent to the lowermost third material layer 85A or overlap with the third material layer 85A. In addition, since the lowermost third material layer 85A serves as a dummy gate electrode of a dummy transistor, margin for impurity diffusion may be ensured. In other words, a distance D between a junction and the third material layer 85B serving as a gate electrode of the actual memory cell or selection transistor may be ensured.

Subsequently, an insulating spacer 86 may be formed, and a junction 87 may be formed in the second source layer 84. Subsequently, a source pickup line 88 electrically connected to the second source layer 84 may be formed.

Figure 9:
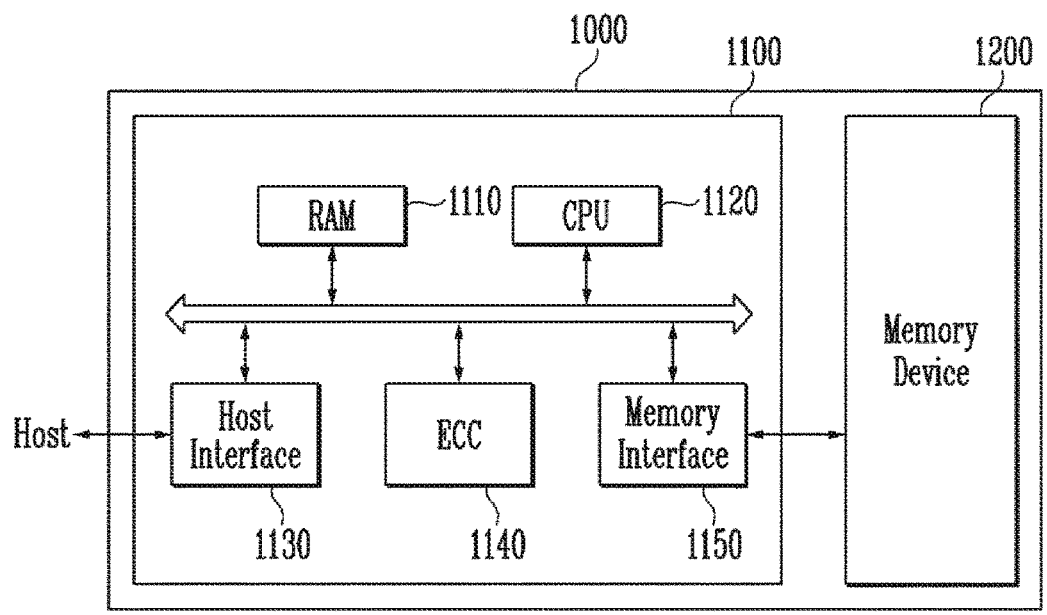
FIGS. 9 and 10 are block diagrams illustrating a configuration of a memory system according to an embodiment of the present invention.

FIG. 9 is a block diagram illustrating a memory system 1000 according to an embodiment.

As illustrated in FIG. 9, the memory system 1000 according to the embodiment may include a memory device 1200 and a controller 1100.

The memory device 1200 may be used to store various types of data such as text, graphic, and software code. The memory device 1200 may be a non-volatile memory and include the structure described with reference to FIGS. 1A to 8H. In addition, the memory device 1200 may be manufactured by the method described above with reference to FIGS. 1A to 8H.

According to the present embodiment, the memory device 1200 may include a stacked structure, channel layers passing through the stacked structure, a well plate located under the stacked structure, a source layer located between the stacked structure and the well plate, a connection structure connecting the channel layers to each other and including a first contact contacting the source layer and a second contact contacting the well plate, and an isolation pattern insulating the source layer and the well plate from each other. A detailed description of the structure and the manufacturing method of the memory device 1200 will be omitted since they are the same as those described above.

The controller 1100 may be coupled to a host and the memory device 1200, and access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The CPU 1120 may control general operations of the controller 1100. For example, the CPU 1120 may operate firmware such as a flash translation layer (FTL) stored in the RAM 110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) for temporary data storage. The buffer memory may temporarily store data externally transferred through the host interface 1130, or temporarily store data transferred from the memory device 1200 through the memory interface 1150. The controller 1100 may further include ROM storing code data to interface with the host.

Since the memory system 1000 according to the present embodiment includes the memory device 1200 having improved integration density and characteristics, the memory system 1000 may also have improved integration density and characteristics.

Figure 10:
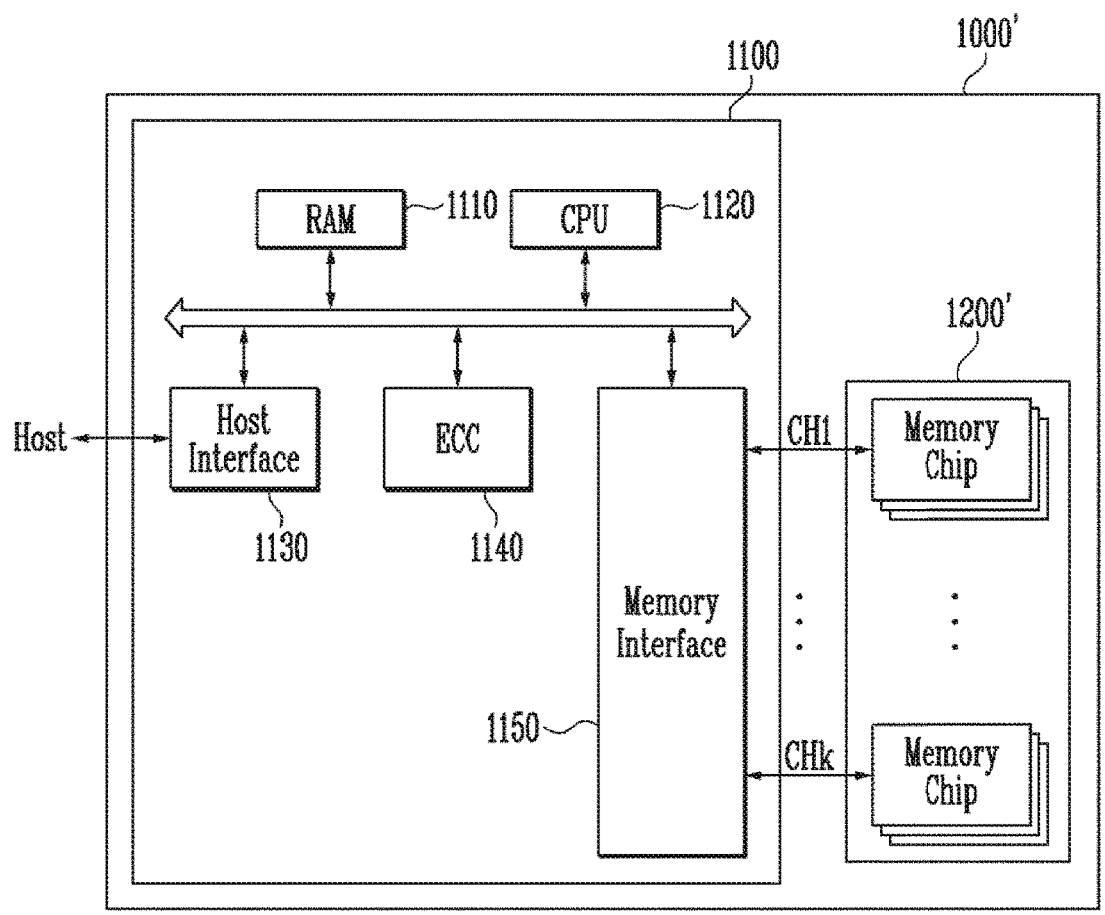

FIG. 10 is a block diagram illustrating a memory system 1000' according to an embodiment. Hereinafter, any repetitive detailed description of components already mentioned above will be omitted.

As illustrated in FIG. 10, the memory system 1000' according to the embodiment may include a memory device 1200' and the controller 1100. The controller 1100 may include the RAM 1110, the CPU 1120, the host interface 1130, the ECC circuit 1140, and the memory interface 1150.

The memory device 1200' may be a non-volatile memory device. The memory device 1200' may include the memory strings described above with reference to FIGS. 1A to 8H. In addition, the memory device 1200' may include a stacked structure, channel layers passing through the stacked structure, a well plate located under the stacked structure, a source layer located between the stacked structure and the well plate, a connection structure connecting the channel layers to each other and including a first contact contacting the source layer and a second contact contacting the well plate, and an isolation pattern insulating the source layer and the well plate from each other.

The memory device 1200' may be a multi-chip package composed of a plurality of memory chips. The plurality of memory chips may be divided into a plurality of groups. The plurality of groups may communicate with the controller 1100 through first to kth channels CH1 to CHk, respectively. In addition, the plurality of memory chips, included in a single group, may communicate with the controller 1100 through a common channel. The memory system 1000' may be modified so that a single memory chip may be coupled to a single channel.

As described above, according to the present embodiment, since the memory system 1000' includes the memory device 1200' having improved integration and characteristics, integration density and characteristics of the memory system 1000' may also be improved. In addition, since the memory device 1200' is formed using a multi-chip package, data storage capacity and driving speed of the memory system 1000' may be further increased.

Figure 11:
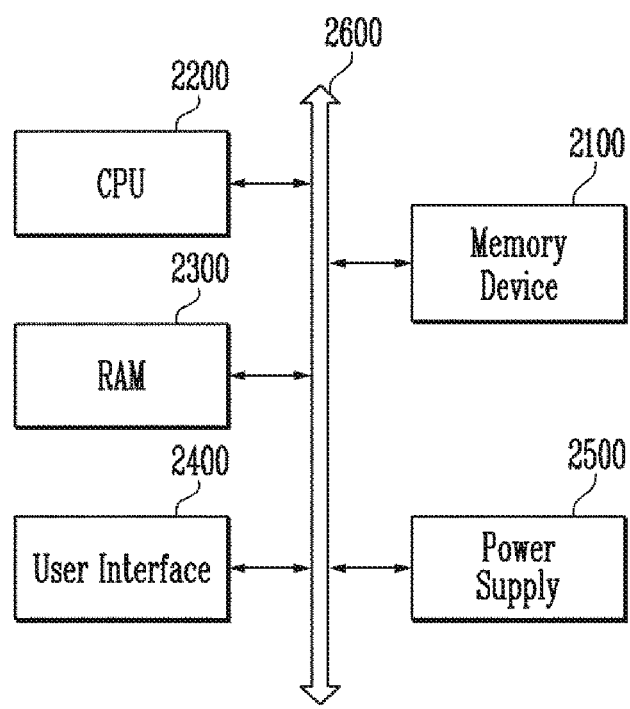
FIGS. 11 and 12 are block diagrams illustrating a configuration of a computing system according to an embodiment of the present invention.

FIG. 11 is a block diagram illustrating a computing system 2000 according to an embodiment. Hereinafter, descriptions of components already mentioned above are omitted.

As illustrated in FIG. 11, the computing system 2000 according to the embodiment may include a memory device 2100, a CPU 2200, a random-access memory (RAM) 2300, a user interface 2400, a power supply 2500, and a system bus 2600.

The memory device 2100 may store data inputted through the user interface 2400, and data processed by the CPU 2200. The memory device 2100 may be electrically coupled to the CPU 2200, the RAM 2300, the user interface 2400, and the power supply 2500. For example, the memory device 2100 may be coupled to the system bus 2600 through a controller (not illustrated) or be directly coupled to the system bus 2600. When the memory device 2100 is directly coupled to the system bus 2600, the CPU 2200, and the RAM 2300 may serve as the controller.

The memory device 2100 may be a non-volatile memory. The memory device 2100 may be the memory string described above with reference to FIGS. 1A to 8H. The memory device 2100 may be manufactured by the method described above with reference to FIGS. 1A to 8H. According to the present embodiment, the memory device 2100 may include a stacked structure, channel layers passing through the stacked structure, a well plate located under the stacked structure, a source layer located between the stacked structure and the well plate, a connection structure connecting the channel layers to each other and including a first contact contacting the source layer and a second contact contacting the well plate, and an isolation pattern insulating the source layer and the well plate from each other.

In addition, as described above with reference to FIG. 10, the memory device 2100 may be a multi-chip package composed of a plurality of memory chips as described above with reference to FIG. 10.

The computing system 2000 having the above-described configuration may be one of various components of an electronic device such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to the present embodiment includes the memory device 2100 having improved integration density and characteristics, characteristics of the computing system 2000 may also be improved.

Figure 12:
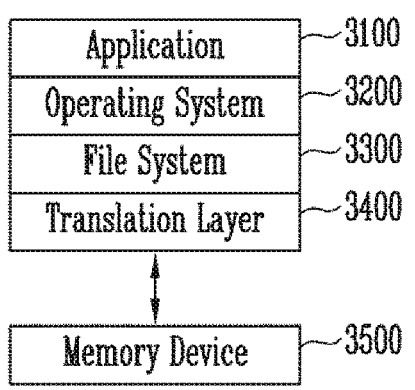

FIG. 12 is a block diagram illustrating a computing system 3000 according to an embodiment.

As illustrated in FIG. 12, the computing system 3000 according to the embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure that manages data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS), or a journaling file system (JFS).

FIG. 12 illustrates the operating system 3200, the application 3100, and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory. The memory device 3500 may include the memory string described above and shown in FIGS. 1A to 8H. The memory device 3500 may include a stacked structure, channel layers passing through the stacked structure, a well plate located under the stacked structure, a source layer located between the stacked structure and the well plate, a connection structure connecting the channel layers to each other and including a first contact contacting the source layer and a second contact contacting the well plate, and an isolation pattern insulating the source layer and the well plate from each other. Since the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to the embodiment includes the memory device 3500 having improved integration density and characteristics, characteristics of the computing system 3000 may also be improved.

According to the various embodiments of the present invention, a semiconductor device having a stabilized structure and improved reliability may be provided. In addition, a method of manufacturing a semiconductor device may be simplified with manufacturing costs.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device, comprising:
    a stacked structure;
    channel layers passing through the stacked structure;
    a well plate located under the stacked structure;
    a source layer located between the stacked structure and the well plate;
    a connection structure coupling the channel layers to each other and including a first contact contacting the source layer and a second contact contacting the well plate; and
    an isolation pattern insulating the source layer and the first contact from well plate and the second contact,
    wherein the first contact is spaced apart from the second contact with the isolation pattern interposed therebetween.

2. The semiconductor device of claim 1, wherein the isolation pattern is interposed between the well plate and the source layer.

3. The semiconductor device of claim 1, wherein the connection structure provides a current path from the channel layers via the first contact to the source layer during a read operation.

4. The semiconductor device of claim 1, wherein the connection structure provides a hole moving path from the well plate via the second contact to the channel layers during an erase operation.

5. The semiconductor device of claim 1, further comprising a source pickup line passing through the stacked structure and electrically coupled to the source layer.

6. The semiconductor device of claim 5, wherein the source layer comprises:
    a first source layer contacting the first contact; and
    a second source layer electrically coupling the first source layer to the source pickup line.

7. The semiconductor device of claim 5, further comprising an insulating spacer surrounding a sidewall of the source pickup line.

8. The semiconductor device of claim 5, further comprising a junction interposed between the source pickup line and the source layer.

9. The semiconductor device of claim 1, wherein the isolation pattern comprises:
    a first area extending along a surface of the well plate; and
    a second area coupled to the first area and extending on a sidewall of the connection structure.

10. The semiconductor device of claim 9, wherein the second area of the isolation pattern is interposed between the first contact and the second contact.

11. The semiconductor device of claim 1, wherein the isolation pattern comprises:
   a first area extending along a surface of the well plate; and
   a second area spaced apart from the first area and contacting a sidewall of a gap-filling insulating layer of the connection structure.

12. The semiconductor device of claim 1, further comprising a memory layer surrounding the channel layers and the connection structure and including an opening through which the first contact and the second contact are exposed.

13. The semiconductor device of claim 1, wherein the connection structure comprises:
   a coupling pattern coupling the channel layers to each other;
   a first contact pattern connecting the coupling pattern to the source layer;
   a second contact pattern connecting the coupling pattern to the well plate; and
   a gap-filling insulating layer in the coupling pattern.

14. The semiconductor device of claim 13, wherein the isolation pattern contacts the gap-filling insulating layer exposed between the first contact pattern and the second contact pattern.

15. The semiconductor device of claim 1, wherein the stacked structure includes conductive layers and insulating layers stacked alternately with each other.

16. The semiconductor device of claim 15, wherein the connection structure protrudes toward an inside of the stacked structure and overlaps at least one lowermost conductive layer, among the conductive layers.

17. The semiconductor device of claim 16, wherein a conductive layer overlapping the connection structure, among the conductive layers, is a gate electrode of a dummy transistor, a selection transistor, or a memory cell.

18. The semiconductor device of claim 1, wherein the first contact directly contacts the source layer and the second contact directly contacts the well plate.

19. The semiconductor device of claim 1, wherein a current path from the channel layers via the first contact to the source layer is formed during a read operation, a hole moving path from the well plate via the second contact to the channel layers is formed during an erase operation, and the current path and the hole moving path are separated from each other by the isolation pattern.

20. A semiconductor device, comprising:
   a stacked structure;
   channel layers passing through the stacked structure;
   a well plate located under the stacked structure;
   a source layer located between the stacked structure and the well plate;
   a coupling pattern coupling the channel layers to each other;
   a first contact pattern directly contacting the coupling pattern and the source layer;
   a second contact pattern directly contacting the coupling pattern and the well plate; and
   an isolation pattern insulating the source layer and the first contact from the well plate and the second contact.

21. A semiconductor device, comprising:
   a stacked structure;
   a channel layer passing through the stacked structure;
   a well plate located under the stacked structure;
   a source layer located between the stacked structure and the well plate;
   a first contact structure contacting the source layer, wherein the source layer is coupled to the channel layer through the first contact structure;
   a second contact structure contacting the well plate, wherein the well plate is coupled to the channel layer through the second contact structure; and
   an isolation pattern insulating the source layer and the first contact structure from the well plate and the second contact structure,
   wherein the first contact structure is spaced apart from the second contact structure with the isolation pattern interposed therebetween.

* * * * *